(12) United States Patent
Nabki et al.

(10) Patent No.: US 10,879,955 B2
(45) Date of Patent: Dec. 29, 2020

(54) ENERGY EFFICIENT ULTRA-WIDEBAND IMPULSE RADIO SYSTEMS AND METHODS

(71) Applicant: TRANSFERT PLUS SOCIETE EN COMMANDITE, Montreal (CA)

(72) Inventors: Frederic Nabki, Montreal (CA); Dominic Deslandes, Chambly (CA); Mohammad Taherzadeh-Sani, Montreal (CA); Michiel Soer, Montreal (CA)

(73) Assignee: Transfert Plus, Societe en Commandite, Montreal (CA)

( * ) Notice: Subject to any disclaimer, the term of this patent is extended or adjusted under 35 U.S.C. 154(b) by 0 days.

(21) Appl. No.: 16/325,416

(22) PCT Filed: Jun. 29, 2018

(86) PCT No.: PCT/CA2018/000135
§ 371 (c)(1),
(2) Date: Feb. 14, 2019

(87) PCT Pub. No.: WO2019/000075
PCT Pub. Date: Jan. 3, 2019

(65) Prior Publication Data
US 2019/0215030 A1 Jul. 11, 2019

Related U.S. Application Data

(60) Provisional application No. 62/527,187, filed on Jun. 30, 2017.

(51) Int. Cl.
*H04B 1/719* (2011.01)
*H04B 1/10* (2006.01)
(Continued)

(52) U.S. Cl.
CPC ............... *H04B 1/719* (2013.01); *H04B 1/10* (2013.01); *H04B 1/7163* (2013.01);
(Continued)

(58) Field of Classification Search
CPC .. H04B 1/719; H04B 1/71637; H04B 1/7183; H04B 1/707; H04B 1/69; H04B 1/7075;
(Continued)

(56) References Cited

U.S. PATENT DOCUMENTS

2003/0067963 A1* 4/2003 Miller .................. H04B 1/7183
375/130
2005/0013390 A1* 1/2005 Tufvesson ............ H04L 27/066
375/340

(Continued)

*Primary Examiner* — Ted M Wang
(74) *Attorney, Agent, or Firm* — Rosenberg, Klein & Lee

(57) ABSTRACT

Ultra-Wideband (UWB) technology exploits modulated coded impulses over a wide frequency spectrum with very low power over a short distance for digital data transmission. Such UWB systems through their receivers may operate in the presence of interfering signals and should provide for robust communications. Accordingly, an accurate and sharp filter that operates at low power is required and beneficially one that does not require a highly accurate power heavy clock. Further, many UWB applications require location and/or range finding of other elements and it would therefore be beneficial to provide a UWB based range finding and/or location capability removing the requirement to add additional device complexity and, typically significant, power consumption.

12 Claims, 14 Drawing Sheets

(51) Int. Cl.
*H04B 1/7163* (2011.01)
*H04W 56/00* (2009.01)
*H04B 1/7183* (2011.01)
*H03H 19/00* (2006.01)
*G06K 7/10* (2006.01)

(52) U.S. Cl.
CPC ....... *H04B 1/7183* (2013.01); *H04B 1/71637* (2013.01); *H04W 56/00* (2013.01); *G06K 7/10306* (2013.01); *H03H 19/002* (2013.01); *H04B 2201/71634* (2013.01)

(58) Field of Classification Search
CPC ......... H04B 1/7163; H04B 2201/71634; H04J 13/10; H04J 13/00; H04W 56/00; H03H 19/002; G06K 7/10306
See application file for complete search history.

(56) References Cited

U.S. PATENT DOCUMENTS

| | | | | |
|---|---|---|---|---|
| 2009/0028220 | A1* | 1/2009 | Roh | H04L 25/0228 375/136 |
| 2015/0288392 | A1* | 10/2015 | Floyd | H04W 16/14 375/130 |
| 2016/0337963 | A1* | 11/2016 | Nabki | H04B 1/713 |
| 2018/0278442 | A1* | 9/2018 | Rogers | H04B 1/1027 |

* cited by examiner

ENERGY EFFICIENT ULTRA-WIDEBAND IMPULSE RADIO SYSTEMS AND METHODS

CROSS-REFERENCE TO RELATED APPLICATIONS

This patent application claims the benefit of priority as a 371 National Phase entry of PCT/CA2018/000,135 filed Jun. 29, 2018 entitled "Energy Efficient Ultra-Wideband Impulse Radio Systems and Methods" which itself claims the benefit of priority from U.S. Provisional Patent Application U.S. 62/527,187 filed Jun. 30, 2017 entitled "Energy Efficient Ultra-Wideband Impulse Radio Systems and Methods."

FIELD OF THE INVENTION

This invention relates to ultra-wideband wireless communications and more particularly to very low power consumption impulse radios exploiting low energy detectors and providing range finding.

BACKGROUND OF THE INVENTION

Ultra-Wideband (UWB) technology is a wireless technology for the transmission of digital data as modulated coded impulses over a very wide frequency spectrum with very low power over a short distance. Such pulse based transmissions are an alternative to transmitting information using a modulated sinusoidal wave, which is the technique currently employed within today's wireless communication standards and systems such as IEEE 802.11 (Wi-Fi), IEEE 802.15 wireless personal area networks (PANs), IEEE 802.16 (WiMAX), Universal Mobile Telecommunications System (UMTS), Global System for Mobile Communications (GSM), General Packet Radio Service (GPRS), and those accessing the Industrial, Scientific and Medical (ISM) bands, and International Mobile Telecommunications-2000 (IMT-2000).

UWB transmission from an antenna is defined by an emitted signal bandwidth that exceeds the lesser of 500 MHz or 20% of the center frequency. Thus, pulse-based systems where each transmitted pulse occupies the full UWB bandwidth or an aggregate of at least 500 MHz of narrow-band carriers; for example, orthogonal frequency-division multiplexing (OFDM); can gain access to the UWB spectrum under the rules. Pulse repetition rates may be either low or very high. Pulse-based UWB radars and imaging systems tend to use low to moderate repetition rates (typically in the range of 1 to 100 megapulses per second). On the other hand, communications systems favor high repetition rates (typically in the range of one to two gigapulses per second), thus enabling short-range gigabit-per-second communications systems. As each pulse in a pulse-based UWB system occupies a large bandwidth, possibly even the entire UWB bandwidth, such systems are relatively immune to multipath fading but not intersymbol interference, unlike carrier modulation based systems which are subject to both deep fading and intersymbol interference (ISI).

When considering applications, such as wireless sensor networks and portable electronics, UWB transceivers should ideally be functionally highly integrated for small footprint, support low cost and high volume manufacturing, and be energy efficient in order to run on a limited power source, e.g. a battery, indoor solar cell, small outdoor solar cell, or those developed upon evolving technologies such as thermal gradients, fluid flow, small fuel cells, piezoelectric energy harvesters, micro-machined batteries, and power over optical fiber. By using discrete pulses as modulation, it is possible to implement efficient duty cycling schemes while the transmitter is not active, which can be further improved by using an On-Off Shift Keying (OOK) modulation.

Further, some UWB operation frequencies, between 3.1 GHz and 10.6 GHz for example, are approved by Federal Communications Committee for indoor UWB communication systems and allow for small antennas which can easily be integrated into overall reduced footprint solutions such as sensors, mobile devices or portable electronics etc. Accordingly, UWB systems with low power consumption can support a wide range of applications including, but not limited to, sensor networks, smart buildings, medical devices, remote sensing, remote monitoring, remote controls, agriculture, industrial, control, automation, personal monitoring, etc.

Such UWB systems through their receivers may also operate in the presence of interfering signals providing for robust communications within noisy wireless environments and unregulated wireless environments. Accordingly, it would be beneficial to provide circuit designers with an accurate and sharp filter that operates at low power. The inventors present such as filtering methodology that removes the requirement for an accurate carrier wave within the receiver.

Within many of the applications for UWB devices the location and/or range finding of other elements with precision is a desirable or obligatory requirement. Accordingly, it would be beneficial to provide circuit, device and system designers with a UWB based range finding and/or location capability removing the requirement to add additional complexity and, typically significant, power consumption by adding global positioning system (GPS) receiver(s) or ultrasonic/laser range finding circuits and/or devices. It would be further beneficial for such UWB based location and/or range finding applications to maintain the overall low power consumption of the UWB impulse radios.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to ultra-wideband wireless communications and more particularly to very low power consumption impulse radios exploiting low energy detectors and providing range finding.

In accordance with an embodiment of the invention there is provided a method of filtering within a UWB receiver by providing an N-path filter employing a low precision clock source in combination with an energy detector.

In accordance with an embodiment of the invention there is provided a method of establishing a range between a pair of Ultra-Wideband (UWB) transceivers comprising:

synchronizing a first ultra-wideband (UWB) transceiver with a second UWB transceiver;

transmitting a first packet from the first UWB transceiver comprising a plurality of UWB pulse bundles;

starting a first timer associated with the first UWB transceiver upon transmission of the last pulse bundle;

processing the received plurality of UWB pulse bundles upon the second UWB transceiver;

synchronizing to a predetermined pulse within the UWB pulse bundles of the first packet using a circuit comprising at least a first correlator and a first delay-locked loop;

starting a second timer associated with the second UWB transceiver upon determining detection of the predetermined pulse within the last pulse bundle of the plurality of pulse bundles;

transmitting a second packet from the second UWB transceiver when the second timer reaches a predetermined wait time;

processing the received plurality of UWB pulse bundles associated with the second upon the first UWB transceiver;

synchronizing to a predetermined pulse within the UWB pulse bundles of the second packet using a circuit comprising at least a second correlator and a second delay-locked loop;

stopping the first timer upon determining detection of the predetermined pulse within the last pulse bundle of the plurality of pulse bundles of the second packet; and calculating the time of flight in dependence upon the elapsed time of the first timer and determining a range between the first UWB transceiver and second UWB transceiver.

In accordance with an embodiment of the invention there is provided a method of establishing a range between a pair of Ultra-Wideband (UWB) transceivers comprising:

transmitting a UWB impulse with a first UWB transceiver operating with a first clock rate having first integration windows in dependence upon the first clock rate;

receiving the UWB impulse at a second UWB transceiver operating with a second clock rate having second integration windows in dependence upon the second clock rate;

integrating received UWB signals within the second integration windows and determining when the received energy within a second integration window exceeds a predetermined threshold that the UWB impulse has been received;

transmitting in the next second integration window after a determination of receipt of the UWB impulse an echo signal;

integrating received UWB signals within the first integration windows and determining when the received energy within a first integration window exceeds a predetermined threshold that the UWB impulse has been received;

passing the integrated energies within the first integration windows to a digital signal processing (DSP) circuit; and deriving an estimate of elapsed time with the DSP circuit.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1A:
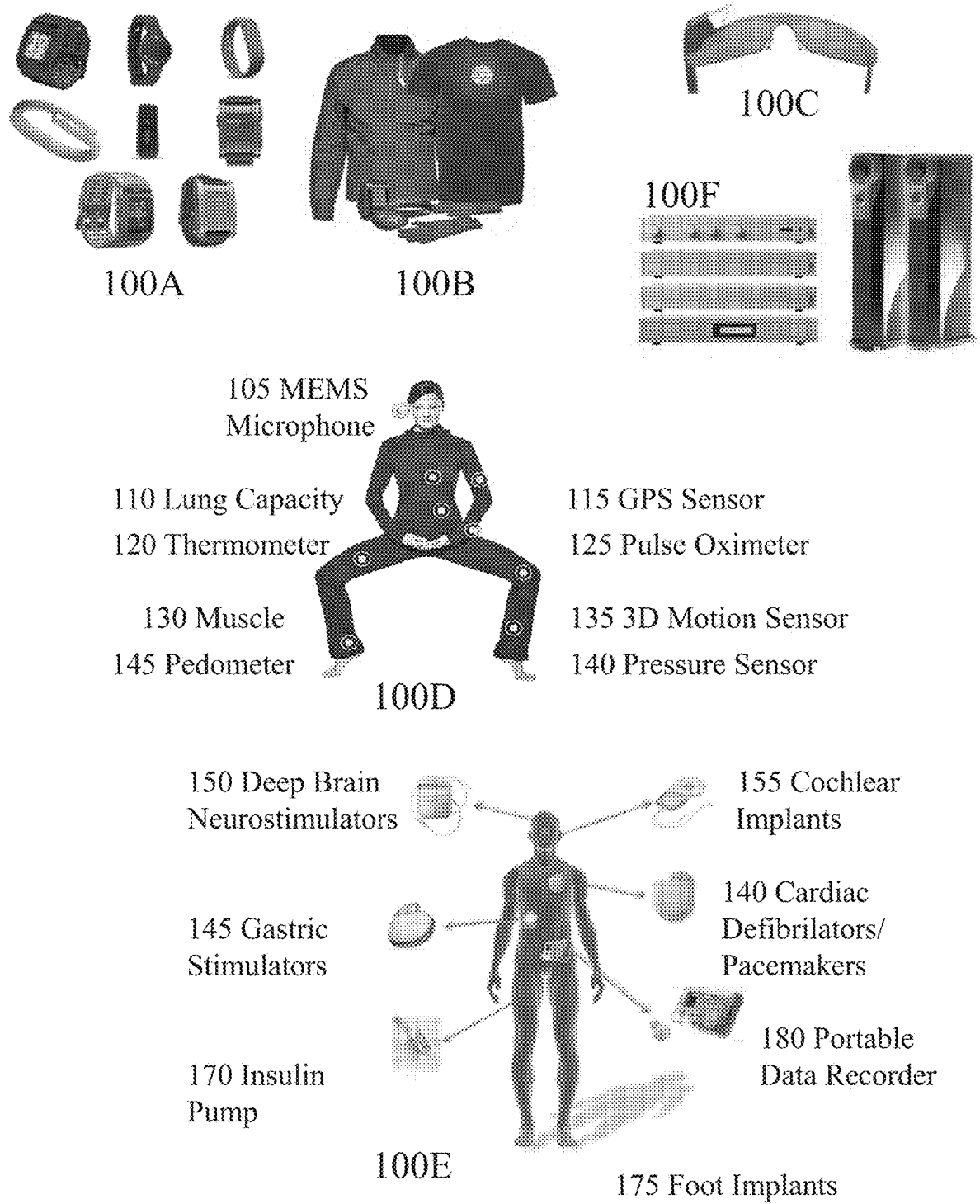
FIG. 1A depicts wearable technology supporting biometric data acquisition and/or presentation exploiting wireless communications according to embodiments of the invention.

The present invention is directed to ultra-wideband wireless communications and more particularly to very low power consumption impulse radios exploiting low energy detectors and providing range finding.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

"Ultra-wideband" (UWB) as used herein and throughout this disclosure, refers to a radio communication system transmitting from an antenna for which the emitted signal bandwidth exceeds the lesser of 500 MHz or 20% of the center frequency.

A "radio" as used herein and throughout this disclosure, refers to a physical implementation of a system that can transmit and receive data wirelessly. This includes, but is not limited to, radio frequency integrated circuits, printed circuit board wireless modules.

An "impulse radio" as used herein and throughout this disclosure, refers to a radio system utilizing impulse-like signals for its transmission.

"Quasi low-IF" as used herein and through this disclosure, refers to an Intermediate Frequency (IF) generated within a RF signal processor circuit, such as a receiver for example, wherein signals within a first frequency range are converted to signals within a second frequency range and is used by the inventors to differentiate their inventive approach over the prior art wherein such conversions with different systems and methods are referred to as either "zero-IF", wherein they employ a subsequent high pass filter to remove a block of frequencies including DC from the second frequency range, or "low-IF", wherein the converted second frequency range includes DC but a subsequent RF circuit or RF element is AC coupled thereby removing a block of frequencies including.

A "portable electronic device" (PED) as used herein and throughout this disclosure, refers to a wireless device used for communications and other applications that requires a battery or other independent form of energy for power. This includes devices, but is not limited to, such as a cellular telephone, smartphone, personal digital assistant (PDA), portable computer, pager, portable multimedia player, portable gaming console, laptop computer, tablet computer, a sensor node, and an electronic reader.

A "fixed electronic device" (FED) as used herein and throughout this disclosure, refers to a wireless and/or wired device used for communications and other applications that requires connection to a fixed interface to obtain power. This includes, but is not limited to, a laptop computer, a personal computer, a computer server, a kiosk, a gaming console, a digital set-top box, an analog set-top box, an Internet enabled appliance, an Internet enabled television, and a multimedia player.

A "user" as used herein may refer to, but is not limited to, an individual or group of individuals whose biometric data may be, but not limited to, monitored, acquired, stored, transmitted, processed and analysed either locally or remotely to the user wherein by their engagement with a service provider, third party provider, enterprise, social network, social media etc. via a dashboard, web service, website, software plug-in, software application, graphical user interface acquires, for example, electronic content. This includes, but is not limited to, private individuals, employees of organizations and/or enterprises, members of community organizations, members of charity organizations, men, women, children, teenagers, and animals. In its broadest sense the user may further include, but not be limited to, software systems, mechanical systems, robotic systems, android systems, etc. that may be characterised by data relating to a subset of conditions including, but not limited to, their environment, medical condition, biological condition, physiological condition, chemical condition, ambient environment condition, position condition, neurological condition, drug condition, and one or more specific aspects of one or more of these said conditions.

A "wearable device" or "wearable sensor" relates to miniature electronic devices that are worn by the user including those under, within, with or on top of clothing and are part of a broader general class of wearable technology which includes "wearable computers" which in contrast are directed to general or special purpose information technologies and media development. Such wearable devices and/or wearable sensors may include, but not be limited to, smartphones, smart watches, e-textiles, smart shirts, activity trackers, smart glasses, environmental sensors, medical sensors, biological sensors, physiological sensors, chemical sensors, ambient environment sensors, position sensors, neurological sensors, drug delivery systems, medical testing and diagnosis devices, and motion sensors.

A: Exemplary Application Scenarios

Embodiments of the invention are described and presented within the context of transmitter/receiver/transceiver systems as described by the inventors within World Intellectual Property Office Application WO/2016/191851 entitled "Systems and Methods for Spectrally Efficient and Energy Efficient Ultra-Wideband Impulse Radios with Scalable Data Rates" filed May 31, 2016 and World Intellectual Property Office Application WO/2015/103692 entitled "Systems relating to Ultra-Wideband Broadcasting comprising Dynamic Frequency and Bandwidth Hopping" filed Jan. 1, 2015. However, it would be evident to one of skill in the art that transmitter/receiver/transceiver designs and systems may be employed whilst exploiting embodiments of the invention with respect to filtering and ranging.

However, the increased efficiency of the transmitter/receiver/transceiver systems established by the inventors within their preceding patent applications identified supra are maintained within the embodiments of the invention. Such low power transmitter/receiver/transceiver systems increase the feasibility of self-powered wireless sensor networks that operate from energy harvested from the environment such as solar, vibration, temperature etc., rather than from batteries where available power is limited, especially in compact, small footprint sensors. Absent such low power requirements for UWB devices then the footprint a UWB transceiver having a footprint of a few square millimeters is completely negated by the requirement for tens of square centimeters of solar cell to power it. Accordingly, very low power UWB devices require reduced solar cell footprint to power them or enable other means to power them which would otherwise not be feasible. Embodiments of the invention are intended to be compatible with the submicron CMOS design and fabrication processes offered by commercial foundries.

Low power UWB transmitters/receivers and transceivers have a range of applications including the examples depicted in first to third images 100A to 100C in FIG. 1A for wearable devices. Within first image 100A examples of wearable devices are depicted whilst within second image 100B examples of smart clothing are depicted wherein UWB devices may be attached to or enclosed within the fabric of these different smart clothing items. Third image 100C depicts an example of a wearable device presenting information to a user in contrast to the devices/clothing in first and second images 100A and 100B respectively that typically collect contextual, environmental, and biometric data and transmit it to another electronic device. However, low power UWB receivers in combination with transducers, LEDs etc. also offer the potential of providing tactile and/or visual feedback to a user in dependence upon received data. In other embodiments LEDs within the smart clothing may be lit based upon UWB signals received by a UWB receiver within the smart clothing.

Smart clothing may be made from a smart fabric and used to allow remote physiological monitoring of various vital signs of the wearer such as heart rate, respiration rate, temperature, activity, and posture for example or alternatively it refers to a conventional material with embedded sensors. A smart shirt may, for example, record an electrocardiogram (ECG) and provide respiration through inductance plethysmography, accelerometry, optical pulse oximetry, galvanic skin response (GSR) for skin moisture monitoring, and blood pressure. Information from such wearable devices may be stored locally or with an associated device, e.g. smartphone, as well as being stored remotely within a personal server, remote cloud based storage, etc. and communicate typically via a wireless network such as Bluetooth, RF, WLAN, or cellular network although wired interfaces may also be provided, e.g. to the user's smartphone, laptop, or dedicated housing, allowing data extraction as well as recharging batteries within the wearable device.

Also depicted in FIG. 1A are fourth and fifth images 100D and 100E respectively of sensors and electronic devices providing biometric data relating to a user. For example, within fourth image 100D a user's smart clothing provides data from sensors including, but not limited to, those providing acoustic environment information via MEMS microphone 105, user breathing analysis through lung capacity sensor 110, global positioning via GPS sensor 115, their temperature and/or ambient temperature via thermometer 120, and blood oxygenation through pulse oximeter 125. These are augmented by exertion data acquired by muscle activity sensor 130, motion data via 3D motion sensor (e.g. 3D accelerometer), user weight/carrying data from pressure sensor 140 and walking/running data from pedometer 145. These may be employed in isolation or in conjunction with other data including, for example, data acquired from medical devices associated with the user such as depicted in fifth image 100E in FIG. 1A.

As depicted these medical devices may include, but are not limited to, deep brain neurostimulators/implants 150, cochlear implant 155, cardiac defibrillator/pacemaker 140, gastric stimulator 145, insulin pump 170, foot implants 175 and Portable Data Recorder 180. Typically, these devices will communicate to a body area aggregator, e.g. smartphone or dedicated wearable computer. Accordingly, it would be apparent that a user may have associated with themselves one or more sensors, either through a conscious decision, e.g. to wear a blood glucose sensor, an unconscious decision, e.g. carrying an accelerometer within their cellphone, or based upon an event, e.g. a pacemaker fitted to address a heart issue. In the majority of these the data transmission from a wearable device to a PED/FED is generally low, e.g. periodic biometric data etc., although in some instances such as smart glasses transmission/receipt of continuous and/or larger volumes of data may be required. Even continuous data acquisition such as heart monitoring, for example, may be transmitted in burst mode as the amount of data even for a minute is not large.

Also depicted in FIG. 1A is sixth image 100F of a Hi-Fi audio system representing an example of electronic equipment connected with UWB wireless impulse radios within a residential, commercial, manufacturing or retail environment. Accordingly, loudspeakers, CD/DVD player, pre-amplifier, power amplifier, turntable etc. may be interconnected as other configurations such as digital set-top box, personal video recorder (PVR), television (TV) or multiple PEDs/FEDs to a wireless router etc. Alternatively, point-of-sale (PoS) terminals may be networked, electronic displays within a retail environment fed from a central server, autonomous robots within a manufacturing facility updated with activities etc.

Figure 1B:
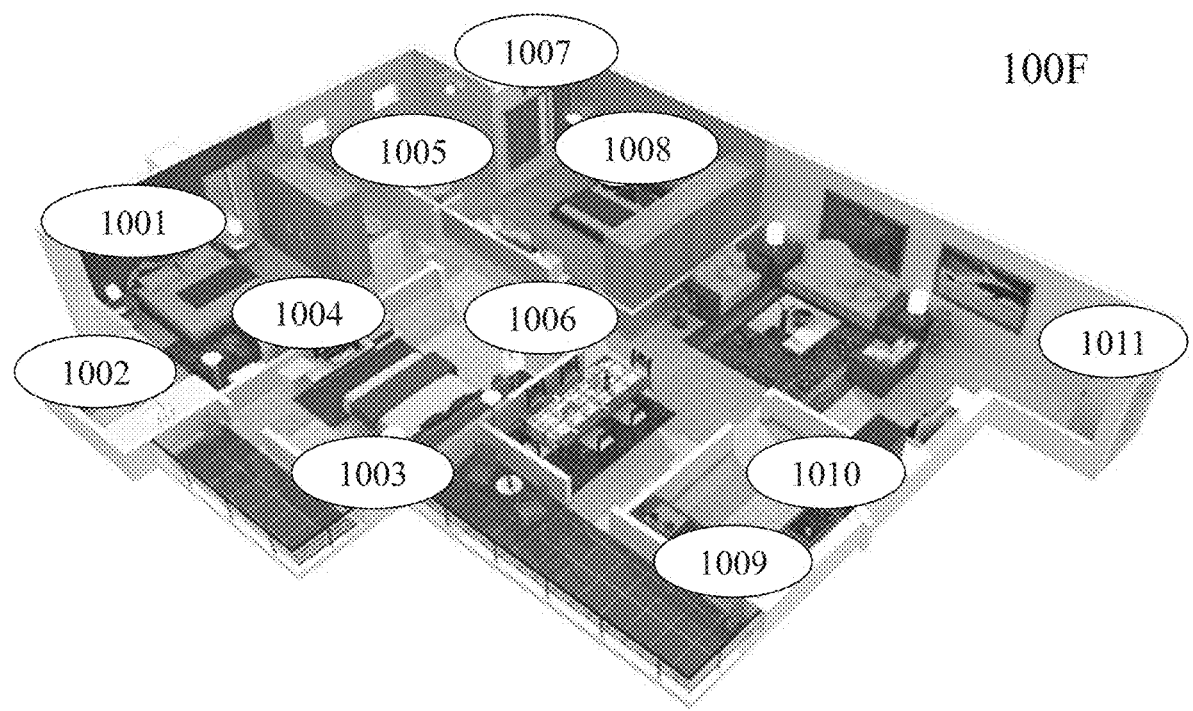
FIG. 1B depicts examples of wireless technology according to embodiments of the invention supporting home automation and location services.
Figure 1B:
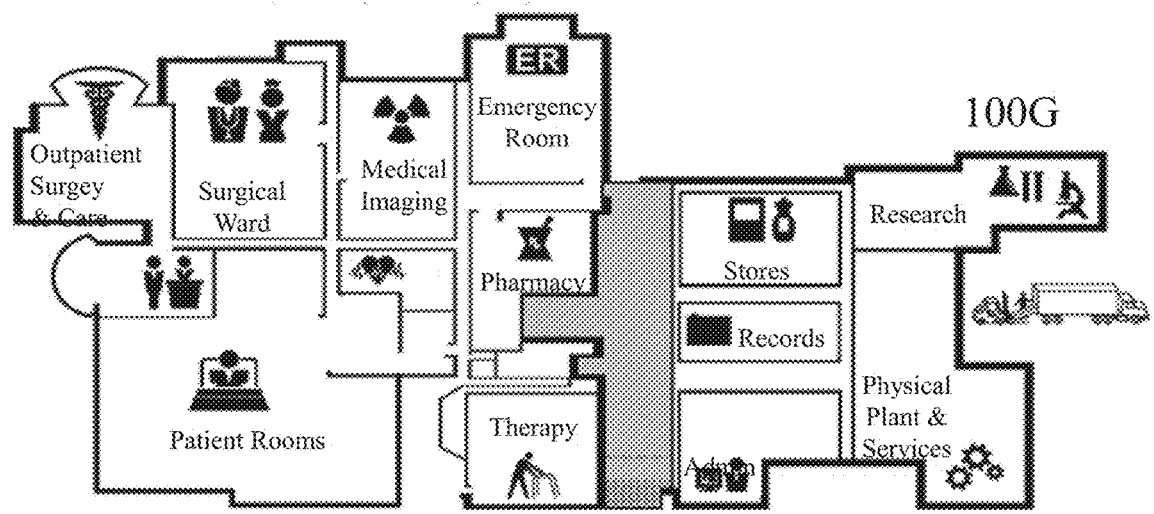

Now referring to FIG. 1B there are depicted first and second environments 100F and 100G respectively relating to examples of deployment scenarios for UWB wireless impulse radios according to embodiments of the invention relating to enhancing residential automation and wireless interconnect in first environment 100F or providing wireless location services of people, equipment, medical supplies in second environment 100G. Considering, first environment 100F then a series of deployment scenarios are depicted including Air Conditioning 1001, Energy Saving-Efficiency 1002, Surveillance 1003, Entertainment 1004, Timer 1005, Lighting 1006, Motor Control 1007, Environment 1008, Sprinkler 1009, Appliances 1010, and Security 1011. In the majority of these the requirements for data transmission/receipt is again quite limited and aperiodic. Similarly, in the second environment 100G depicting a simplistic schematic of a hospital wireless based location services, inventory tracking services etc. can range from tracking patients to hospital equipment such as trolleys, diffusion pumps, etc. through to medical device connectivity, such as patient monitors, electrocardiograms (EKGs), etc. and medical consumables etc. Again data rates are typically low but in addition there may be a large number of concurrently operating devices within a small area where interference is unacceptable.

Within such environments data relating to occupancy of a region within either of the first and second environments 100F and 100G respectively may augment these other UWB enabled sensors etc. or provide an override. For example, a lighting controller 1006 within a room may determine a low light level and seek to turn the lights on. However, if an occupancy sensor based upon UWB ranging determines no user within the room then the lighting controller 1006 is "over-ruled." However, in other embodiments the lighting controller 1006 may be associated with a large area with multiple lighting fixtures and virtually established zones. Accordingly, a UWB ranging device according to an embodiment of the invention may determine whether individuals are presented within a predetermined range of the UWB ranging device and hence associated with its zone. In this manner lights within a corridor, for example, may be turned on and off to reflect occupancy or may be turned on ahead of and turned off behind a security guard for example walking down the corridor at night.

B: Dynamic Multi-Pulse Bundle Structure for a Bit

Within the inventors prior patent applications WO/2016/191851 "Systems and Methods for Spectrally Efficient and Energy Efficient Ultra-Wideband Impulse Radios with Scalable Data Rates" and WO/2015/103692 "Systems relating to Ultra-Wideband Broadcasting comprising Dynamic Frequency and Bandwidth Hopping", which are incorporated herein by reference, a design methodology for impulse radio based on pulse bundles was established wherein by exploiting multiple pulses per bundle with real-time configurable parameters such as phase, frequency, amplitude, and bandwidth the inventors established UWB transmitter designs which can dynamically fill the UWB spectrum. UWB communications allow for transmission using a wide frequency band provided that the spectral mask of the appropriate regulatory body is adhered to. For example, in the United States the allocated frequency band is $3.1 \text{ GHz} \leq f \leq 10.6 \text{ GHz}$, and the Federal Communication Commission (FCC) dictates the spectral mask with respect to maximum transmitted power in different sub-bands across this allocated frequency band. This enables pulsed operation, which has the advantage of low power consumption, since a transceiver can be duty-cycled to consume power only when a pulse is to be transmitted or received. Since the spectral mask allows for a fixed maximum power spectral density for transmissions, it is advantageous to maximize the occupied bandwidth in order to maximize the symbol energy and extend the range achievable by a wireless link. However, using a single pulse for communication causes a trade-off between the pulse bandwidth and the required synchronization accuracy since an increase in pulse bandwidth corresponds to a decrease in pulse duration, resulting in a more challenging and potentially costlier circuit implementation with increased energy needed for synchronization.

Figure 2A:
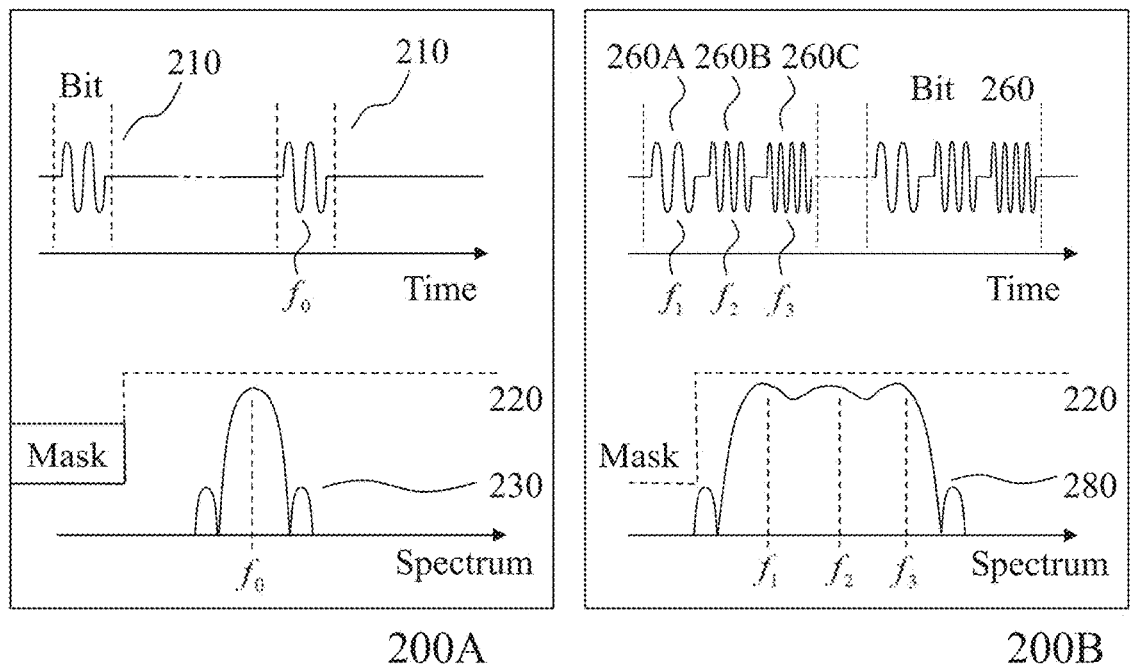
FIG. 2A depicts a single-pulse UWB protocol according to the prior art together with a multi-pulse symbol UWB protocol according to an embodiment of the invention.

The inventors addressed this trade-off and removed it through the conceptual step of applying multiple pulses with different frequency spectrum to the generation of a bit. Referring to FIG. 2A in first image 200A there are depicted time and frequency domain schematics for a prior art impulse radio wherein each bit 210 is a pulsed oscillation at a single frequency such that the frequency spectrum is a single peak 230 centered at $f_0$ within the frequency range allowed by the regulatory authority UWB mask 220 and below the maximum power within that frequency range. In contrast as depicted in second image 200B in FIG. 2A each bit 260 comprises a series of sub-pulses 260A to 260C which are each at frequencies $f_1$; $f_2$; $f_3$ respectively. Accordingly, the multi-pulse spectrum 280 of a symbol (bit 260) is obtained conceptually (phase scrambling is omitted for clarity) by summing the individual pulse spectra of the sub-pulses 260A to 260C, which increases the bandwidth while increasing the total symbol duration, in contrast with the single-pulse prior art method, whilst maintaining the maximum power below the UWB mask 220 allowing the symbol energy to be maximized while relaxing the timing requirements and level of synchronization required at the receiver. An arbitrary number of pulses with different sets of parameters may be included within a bundle to tailor the pulse spectrum to a given requirement.

In order to provide the most signal energy without violating the emission mask, the phase of the pulses must be randomized, i.e. the spectrum needs to be whitened to avoid the generation of "spectral lines" generally found in periodic signals, and the correlation between pulses has to be reduced to ensure that the multi-pulse spectrum is the sum of the individual pulse spectra. This can be performed by applying a pseudo random noise (PRN) sequence to the phase modulation in the power amplifier of the transmitter. Since the receiver is not sensitive to the phase of the signal (due to its non-coherent detection scheme, as will be described later), no phase synchronization between transmitter and receiver is required in order to achieve this. The precise spectral shape of the transmitted signal can be controlled by generating pulses with different frequencies and durations in each symbol. The symbol or bit is referred to as comprising a "pulse bundle" by the inventors. The spectrum of the pulse bundle is easily calculated, as its power is the sum of the individual pulse power spectra. This allows for easy dynamic reconfigurability in response to changes in the environment or user demands, and also allows operation across different regulatory environments.

Due to the pulsed nature of the signal, out-of-band spectral sidelobes are present. Even though pulse shaping reduces the sidelobe level, the maxima of the sidelobes can be several dBs above the average out-of-band power spectral density. By applying a PRN sequence to the least significant bit (LSB) of the duty cycling control bit, the width of each pulse may be randomly dithered. This equivalently dithers the location of sidelobes and nulls in the out-of-band spectrum, thus effectively whitening the out-of-band spectrum to its average value and increasing the margin towards the FCC spectral mask.

Figure 2B:
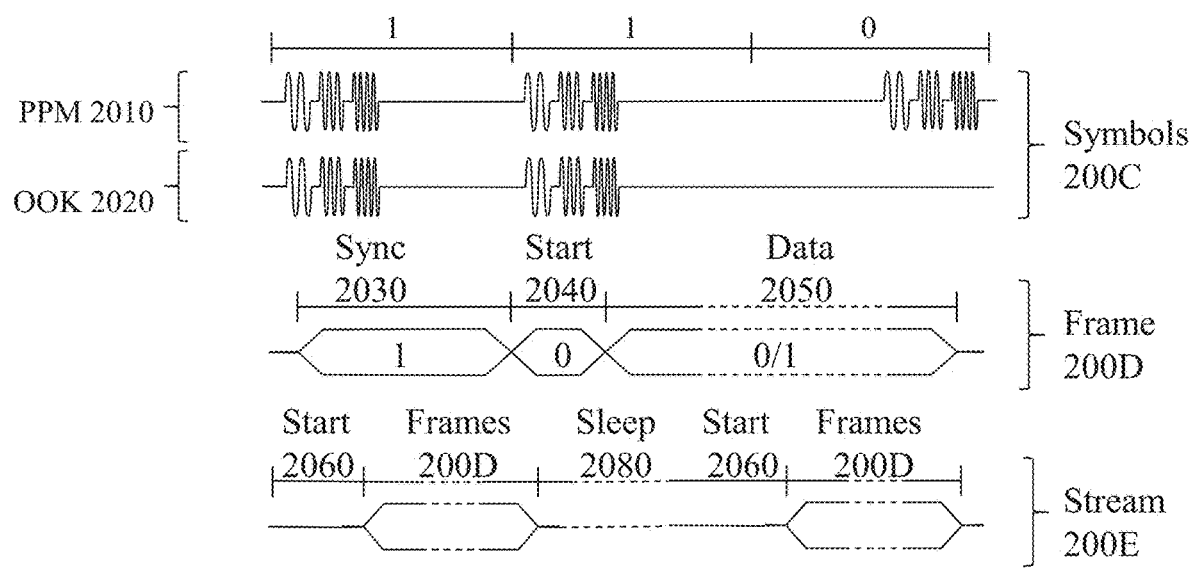
FIG. 2B depicts symbol, frame, and stream structures for a multi-pulse symbol UWB protocol according to an embodiment of the invention.

Modulation of the wideband data stream can be achieved through On-Off Keying (OOK) or Pulse Position Modulation (PPM), for example, as is shown in FIG. 2B. In OOK modulation 2020, the presence of a pulse bundle indicates a "1", and the absence of a bundle indicates a "0". This is a lower power communication scheme since the transmitter only needs to be active when a "1" is to be sent, and can remain in sleep mode when the data bit is a "0". This can also increase the communications range since data is only being transmitted roughly half of the time (ensured by appropriate data coding), which means each pulse bundle can contain more energy and still meet the emissions mask imposed by the regulatory body.

However, OOK modulation requires a defined threshold in order to make a decision as to whether the received data was a "1" or a "0". This can reduce performance in environments with rapid changes in either the channel characteristics or the level of interfering signals. In these situations, PPM modulation 2010 may be preferred as an alternate modulation scheme, for example. In this case, it is the location of the pulse bundle within the symbol period that determines whether a "1" or a "0" was received. The detector in essence compares the energy received in the first half of the symbol period to that received in the second half of the symbol period to make a decision, thus creating a frame-level threshold that can compensate for rapidly changing environments. The ability to switch between OOK and PPM modulation within the same transmitter-receiver pair according to the inventor's designs is made possible by using a burst-mode communications scheme with a parallel digitization architecture.

Accordingly, in FIG. 2B there are depicted the symbols 200C for the PPM 2010 and OOK 2020 modulation schemes. Further, a frame structure 200D is depicted wherein each frame 200D is preceded by a synchronization block 2030 in order to achieve fine synchronization in the receiver, as well as a start bit 2040 to correct for drift in the symbol synchronization before the data 2050 is transmitted/received. Due to the simple synchronization structure, only a short synchronization block 2030 is required, reducing its overhead on the effective data rate of the system. Between frames 200D, the transmitter and receiver are powered down in order to reduce power consumption. This yields a stream 200E having a resulting structure of start 2060, frame 200D, and sleep 2080.

Such a transmission protocol is also well suited for reconfigurable data rates. As an illustrative example of the system operation, assume a data rate of 1 Mbps, a frame size of 1 kbit, and a burst data rate of 20 Mbps, e.g. within a frame a symbol is sent every 50 ns. In this example, each frame would have a duration of 50 μs. To achieve a 1 Mbps data rate, the frame repetition rate would be 1 kHz, i.e. a frame is sent every 1 ms. This means the receiver would only be active for 50 μs every 1 ms, leading to a duty-cycle of 5%. To achieve a 100 kbps data rate with the same frame rate and duration, the only necessary change would be to reduce the frame repetition rate to 10 ms (i.e., a frame sent every 10 ms). Now the receiver would only be active for 50 μs every 10 ms, leading to a duty-cycle of 0.5%. Thus, a 10× reduction in data rate would also lead to a 10× reduction in the power consumption.

C: Exemplary UWB Transmitter

Figure 3:
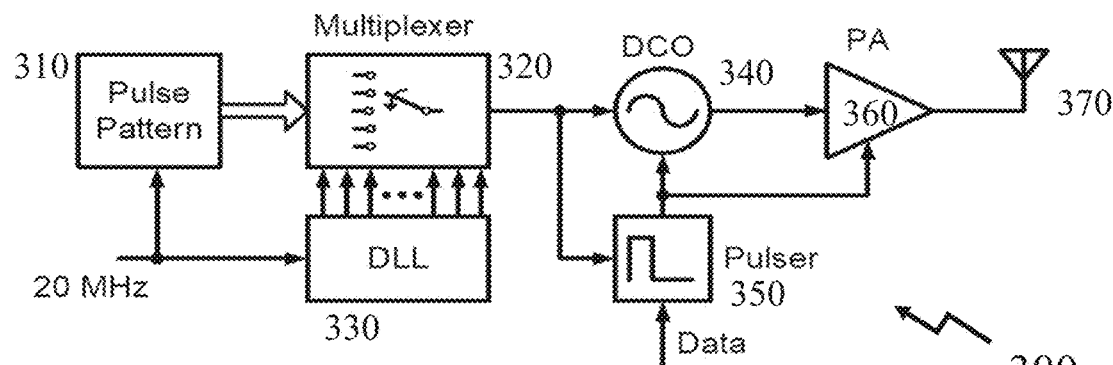
FIG. 3 depicts a transmitter circuit schematic for a UWB transmitter/transceiver according to an embodiment of the invention.

Referring to FIG. 3 there is depicted a schematic of a transmitter 300 according to an embodiment of the invention. A Pulse Pattern block 310 holds the configuration for the pulses used to represent the current symbol. From the symbol-rate clock (i.e. 20 MHz), multiple phases are generated by a Delay Locked Loop (DLL) 330. The rising edge of each clock phase represents the start of one pulse in the symbol pulse bundle. A multiplexer 320 is triggered by the edges of the clock phases and selects the configuration of the current pulse out of the Pulse Pattern block 310. A pulse generator (Pulser) 350 generates pulses with a pulse width set by the multiplexer 320 and enables the Digitally Controlled Oscillator (DCO) 340 and Power Amplifier (PA) 350. When enabled, the DCO 340 generates a Gaussian shaped pulse with frequency set by the multiplexer 320, which is then amplified by the PA 360 and radiated by the antenna 370. Accordingly, the Pulse Pattern block 310 establishes the pulses for a symbol or sequence of symbols. In this manner updating the Pulse Pattern block 310 adjusts the pulse sequence employed for each symbol and accordingly the Pulse Pattern block 310 may be dynamically updated based upon one or more factors including, but not limited to, network environment data, predetermined sequence, date, time, geographic location, signal-to-noise ratio (SNR) of received signals, and regulatory mask.

C1. Transmitter Pulse Generation and Shaping

The DCO 340 output may be shaped to provide a predetermined frequency and/or amplitude characteristic discretely or in combination with the action of the Pulser 350. For example, within embodiments of the invention described within this specification the use of Gaussian shaping and a method of shaping Gaussian pulses are presented and employed. The embodiment depicted within this patent employs shaping the pulse via the PA 360 through adjustment of its ground connection. This allows the transmitter to operate in the digital domain in its entirety, allowing for an all-digital structure with negligible static current consumption. Further, the use of a fully digital transmitter structure allows for very aggressive power cycling, i.e. at the pulse-level. However, in other embodiments alternate shaping methodologies and shape profiles may be employed.

C2. Ground-Switched Power Amplifier

Figure 4:
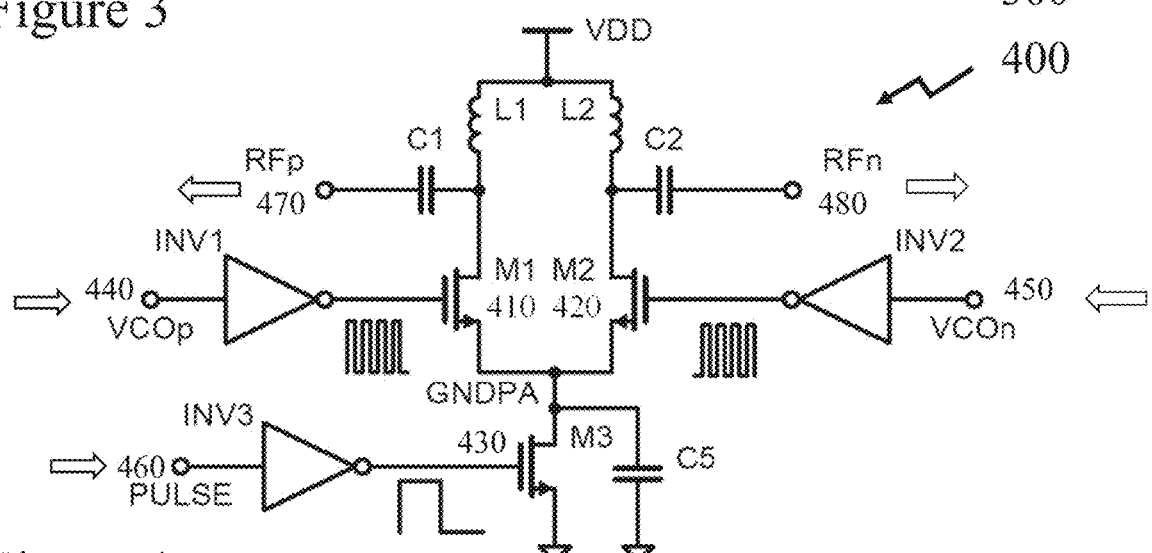
FIG. 4 depicts a ground-switch power amplifier circuit schematic for a UWB transmitter/transceiver according to an embodiment of the invention.

The pulsed nature of UWB transmissions requires a power amplifier (PA) capable of delivering a high instantaneous power level with pulse shaping to reduce the sidelobes of the pulse spectrum. High power efficiency, efficient power cycling and fast wakeup/sleep transition times are required to achieve low average power consumption. A switching power amplifier (SW-PA) 400 as depicted in FIG. 4 has been adopted within the embodiment of the invention presented within this specification in order to transmit the UWB pulse bundles. SW-PA 400 therefore representing an embodiment of the PA 360 in FIG. 3. As depicted first and second transistors M1 410 and M2 420 act as switches whose inputs are complementary digital clocks generated by the DCO, allowing a fully-differential SW-PA 400 to be realized. The frequency of these digital clocks sets the center frequency of each individual pulse in a pulse bundle, and the pulse enable signal applied to third transistor M3 430 sets the duration of each pulse. Accordingly, the complementary digital clocks are provided by $VCO_P$ 440 and $VCO_N$ 450 whilst the pulse enable/pulse duration is the pulsed signals provided by the Pulser 350 which is coupled to PULSE 460 such that the SW-PA 400 ground connection via third transistor M3 430 is modified by this signal. The SW-PA 400 outputs being provided at $RF_P$ 470 and $RF_N$ 480 with the SW-PA 400 coupled to a power rail $V_{DD}$.

The functionality can be described by considering only one side (half circuit) of the differential SW-PA 400 since the symmetry forces the operation of the other side to be identical. The SW-PA 400 output, in this instance $RF_P$ 470 is connected to the $GND_{PA}$ node when the first transistor M1 410 is ON. Since the DC voltage of the SW-PA 400 output is $V_{DD}$ (through the inductor $L_1$), the SW-PA 400 output becomes $V_{DD}+(V_{DD}-GND_{PA})=2\times V_{DD}-GND_{PA}$ when the first transistor M1 410 M1 is OFF. Combining these two cases yields an output swing of $2\times V_{DD}-GND_{PA}$. Hence, by shaping the voltage of the $GND_{PA}$ node, the SW-PA 400 output can be a directly shaped version of the clock signal to generate the output pulse. By design, the output pulse is shaped by the third transistor M3 430 and C5 to realize a Gaussian profile for optimum balance between the pulse duration and bandwidth, and to minimize the sidelobe power in the pulse spectrum. The SW-PA 400 generates an output pulse when activated by the third transistor M3 430, which serves as an enable switch to ensure the power amplifier only consumes static power.

C3. Digitally Controlled Oscillator

Figure 5:
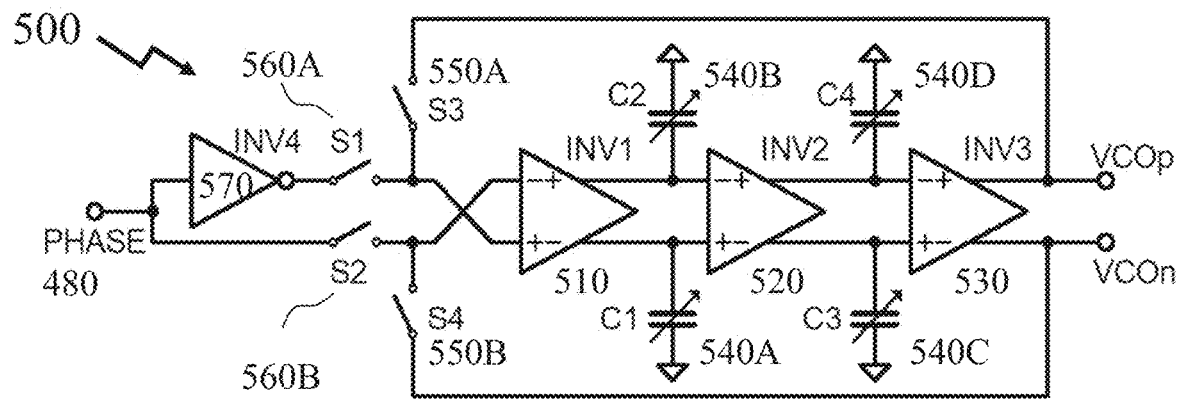
FIG. 5 depicts a digitally controlled oscillator circuit schematic for a UWB transmitter/transceiver according to an embodiment of the invention.

A fully differential ring DCO (FDR-DCO) 500 as depicted in FIG. 5 has been adopted within the embodiment of the invention presented within this specification and as such FDR-DCO 500 therefore represents an embodiment of the DCO 340 in FIG. 3. FDR-DCO 500 provides the digital clock to the first and second transistors M1 510 and M2 520 with SW-PA 400 in FIG. 4 and is fed with the output of Pulser 350 in order to toggle its operation and generate the clock that is fed to the SW-PA 400. The frequency of this FDR-DCO 500 is set by the first and second capacitor banks, comprising first and second capacitors C1 540A and C2

540B and third and fourth capacitors C3 540C and C4 540D respectively, which are connected to the outputs of the first and second fully-differential inverters INV1 510 and INV2 520 respectively. The output from the third fully-differential inverter INV3 530 provides the complementary digital clocks $VCO_P$ and $VCO_N$ which are coupled to $VCO_P$ 440 and $VCO_N$ 450 of the SW-PA 400.

Accordingly, within an embodiment of the invention, first to fourth capacitors C1 540A to C4 540D have identical capacitance values and each is a programmable capacitor bank with 4 bits of programmability although other levels of programmability etc. may be employed. Third and fourth switches S3 550A and S4 550B are used to turn off the FDR-DCO 500 and save power when no pulse is to be sent. Fourth inverter INV4 570 in conjunction with first and second switches S1 560A and S2 560B pre-charge the oscillator nodes before oscillation (when FDR-DCO 500 is off), to control the polarity of the pulse for phase modulation. This also creates an oscillator with a very fast startup time (on the order of a fraction of ns), leading to increased power cycling efficiency in the transmitter. When a pulse is to be generated, the FDR-DCO 500 is enabled by opening first and second switches S1 560A and S2 560B and closing third and fourth switches S3 550A and S4 550B, whilst at all other times the FDR-DCO 500 is in a low power sleep state. Optionally, an additional PMOS transistor may be added between the $V_{DD}$ and current branches of the SW-PA 400 in order to quickly switch off the SW-PA 400 at the end of the pulse and improve the pulse shaping.

C4. Pulse Generator

Figure 6:
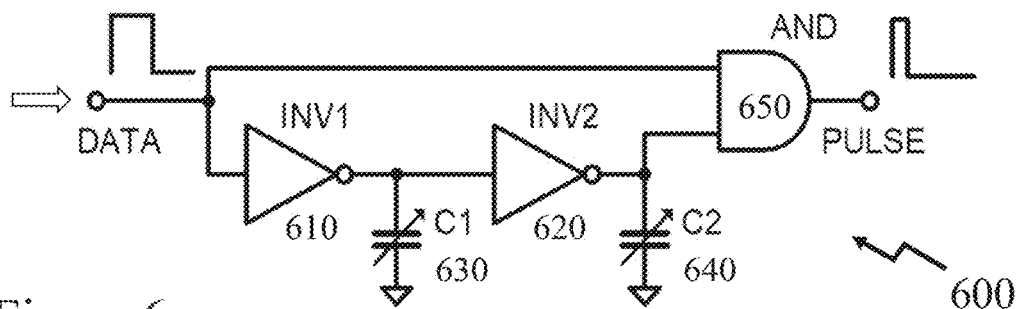
FIG. 6 depicts a pulse generator circuit schematic for a UWB transmitter/transceiver according to an embodiment of the invention.

A pulse signal from the Pulser 350 coupled to the DCO 340, e.g. FDR-DCO 500, and PA 360, e.g. SW-PA 400, is generated using a pulse generation circuit. Accordingly, pulse generator (PULGEN) 600 as depicted in FIG. 6 has been adopted within the embodiment of the invention presented within this specification and as such PULGEN 600 therefore represents an embodiment of the Pulser 350 in FIG. 3. As depicted an input signal is routed directly and indirectly via first and second inverters INV 1 610 and INV2 620 to an AND gate 650. The first and second inverters INV 1 610 and INV2 620 are part of a variable delay circuit in combination with first and second capacitors C1 630 and C2 640 which are programmable capacitor banks, although other levels of programmability etc. may be employed. Accordingly, a rising edge on the DATA line causes this circuit to create a pulse on the order of ns. The pulse width is a function of the variable delay created by the first and second capacitors C1 630 and C2 640, which through being digitally tunable allow the pulse width to be digitally programmed.

D. Exemplary UWB Receiver

Figure 7:
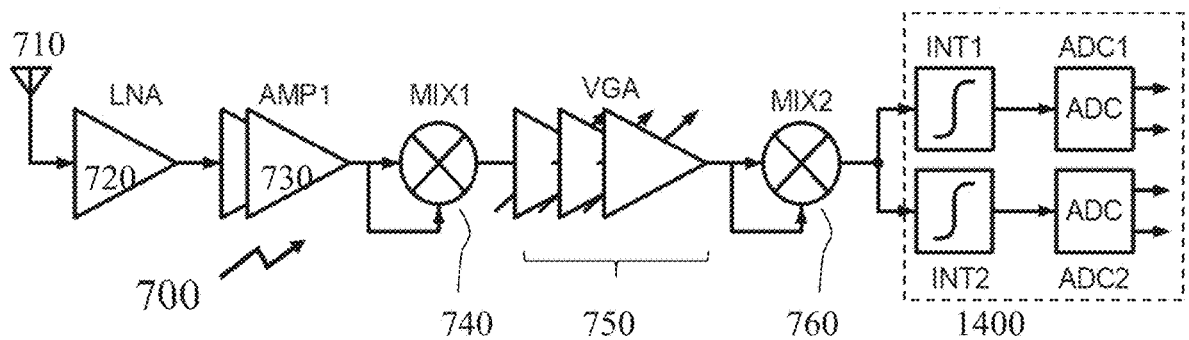
FIG. 7 depicts a receiver circuit schematic for a UWB receiver/transceiver according to an embodiment of the invention.

Referring to FIG. 7 there is depicted a schematic of a receiver 700 according to an embodiment of the invention. The RF signal from the antenna 710 is initially amplified by a Low Noise Amplifier (LNA) 720 before being passed to a two stage RF amplifier (AMP1) 730. A first squaring mixer (MIX1) 740 multiplies the signal with itself to convert to the Intermediate Frequency (IF). A three-stage Variable Gain Amplifier (VGA) 750 amplifies the signal further and implements a bandpass filter function. The VGA 750 output is then coupled to a second squaring mixer (MIX2) 760 which down-converts the signal to the baseband frequency. A parallel integrator (INT1 and INT2) sums the signal energy, which is digitized by the Analog-to-Digital Converters (ADC1 and ADC2) within a digital processor (not depicted for clarity but described for example with respect to digital processor (DIGIPRO) 1200 below in respect of FIG. 12).

D1. Receiver Detection and Interference Rejection

The receiver IF chain utilizes an instantaneous bandwidth that is on the order of an individual pulse bandwidth, e.g. 500 MHz, whilst the total spectrum covers a much wider bandwidth, e.g. 3 GHz≤f≤6 GHz for a BW=3 GHz via the pulse bundle strategy. This allows for lower power consumption of the circuit blocks after pulse down-conversion, whilst still allowing for an ultra-wide bandwidth spectrum to be used for communications. Receivers for UWB signals are challenging due to the wide bandwidth of the desired signal, which requires a high bandwidth receiver chain. Additionally, the occurrence of in-band narrowband interferers, DC offsets, and 1/f noise are also problematic in low power implementations. Accordingly, it would be desirable for the IF stage to:

operate with a quasi-low-IF architecture to circumvent the DC offset problem;

reduce 1/f noise of the RF section, and reject typical narrowband interference (e.g., signals with BW<50 MHz) in order to increase system robustness and interference rejection.

In order to achieve this, high pass decoupling capacitors are specified within the receiver 700 in order to ensure that an insignificant amount of the desired pulse energy is cut-off during this process. Further, this is coupled with a second squaring stage after the IF stage so as to retain full sensitivity. A double squaring method for the enhancement of the energy detection sensitivity/noise rejection in the receiver and the generation of a rectified signal is well-suited for CMOS integration. This double squaring method takes advantage of the impulse nature of the received signals in order to enhance detection as it effectively equates to a non-linear processing of each impulse. The first squaring operation down-converts the received pulse to the quasi low-IF signal whilst the 2nd squaring operation allows the use of the entire down-converted pulse energy to increase the probability of detection instead of just using the detected amplitude/peak as undertaken in other prior art impulse radio receivers. As mentioned, the high-pass filtering between the two squaring operations gives rise to DC offset mitigation, reduction of 1/f noise, and narrowband interference rejection.

It would be evident to one skilled in the art that beneficially the non-coherent receiver architecture presented in respect of FIG. 7 does not require frequency synchronization, or knowledge of the pulse phase/frequency pattern used by the transmitter.

D2. Low Noise Amplifier

Figure 8:
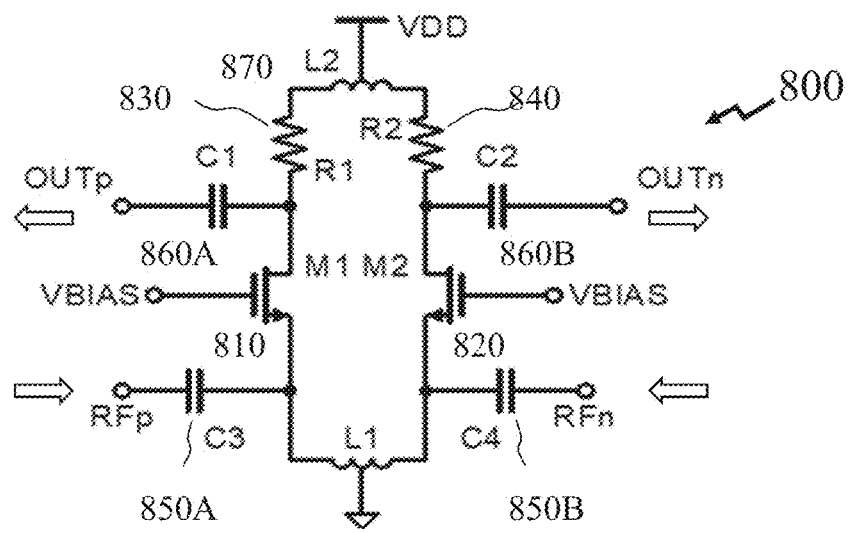
FIG. 8 depicts a low noise amplifier circuit schematic for a UWB receiver/transceiver according to an embodiment of the invention.

A low noise amplifier (LNA) 800 as depicted in FIG. 8 has been adopted within the embodiment of the invention presented within this specification and as such LNA 800 therefore represents an embodiment of the LNA 720 in FIG. 7. Differential input signals $RF_p$ and $RF_n$ are coupled through third and fourth capacitors C3 850A and C4 850B respectively to the drains of the pair of common-gate transistors M1 810 and M2 820 which are biased on their gates by $V_{BIAS}$ and whose bias current is sunk to ground via inductor L1. At the drains of M1 810 and M2 820, shunt peaking is performed by resistors R1 830 and R2 840 in conjunction with inductor L2 870 in order to increase the bandwidth of the amplified signal. The signal is coupled out of the LNA 800 by first and second capacitors C1 860A and C2 860B to the output ports $OUT_P$ and $OUT_N$.

D3. Squaring Mixer

Figure 9:
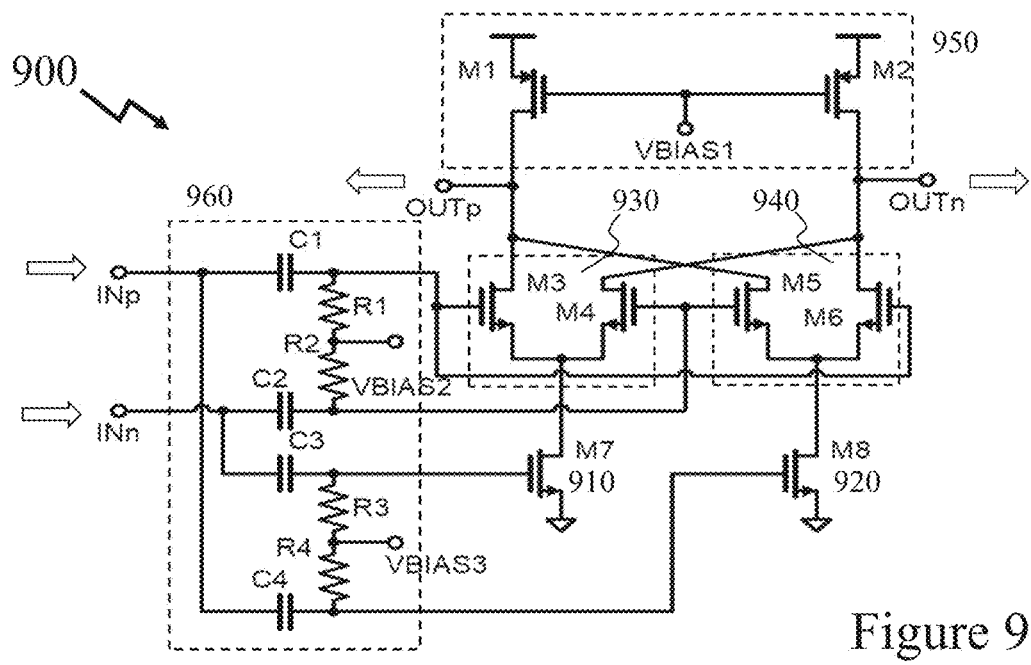
FIG. 9 depicts a squaring mixer circuit schematic for a UWB receiver/transceiver according to an embodiment of the invention.

A squaring mixer (SQ-MIX) 900 as depicted in FIG. 9 has been adopted within the embodiment of the invention presented within this specification and as such SQ-MIX 900 therefore represents an embodiment of the first and second squaring mixers MIX1 740 and MIX2 760 in FIG. 7. As depicted the differential input signals $IN_P$ and $IN_N$ are coupled to the gates of transistors M7 910 and M8 920, whose transconductances convert the signals into a differential drain current. Simultaneously, the input signals are also coupled to the cross-coupled transistor pairs M3:M4 and M5:M6, which steer the drain currents to either the positive ($OUT_P$) or negative ($OUT_N$) sides of SQ-MIX 900, thereby multiplying the input with itself, i.e. squaring it. Transistors M1 and M2 are biased as current source 950, to provide maximum voltage gain at the outputs. Biasing circuit 960 coupled to the input signals and comprising capacitors C1 to C4 and resistors R1 to R4 ensures that the NMOS transistors are biased to the appropriate bias point.

D4. Variable Gain Amplifier

Figure 10:
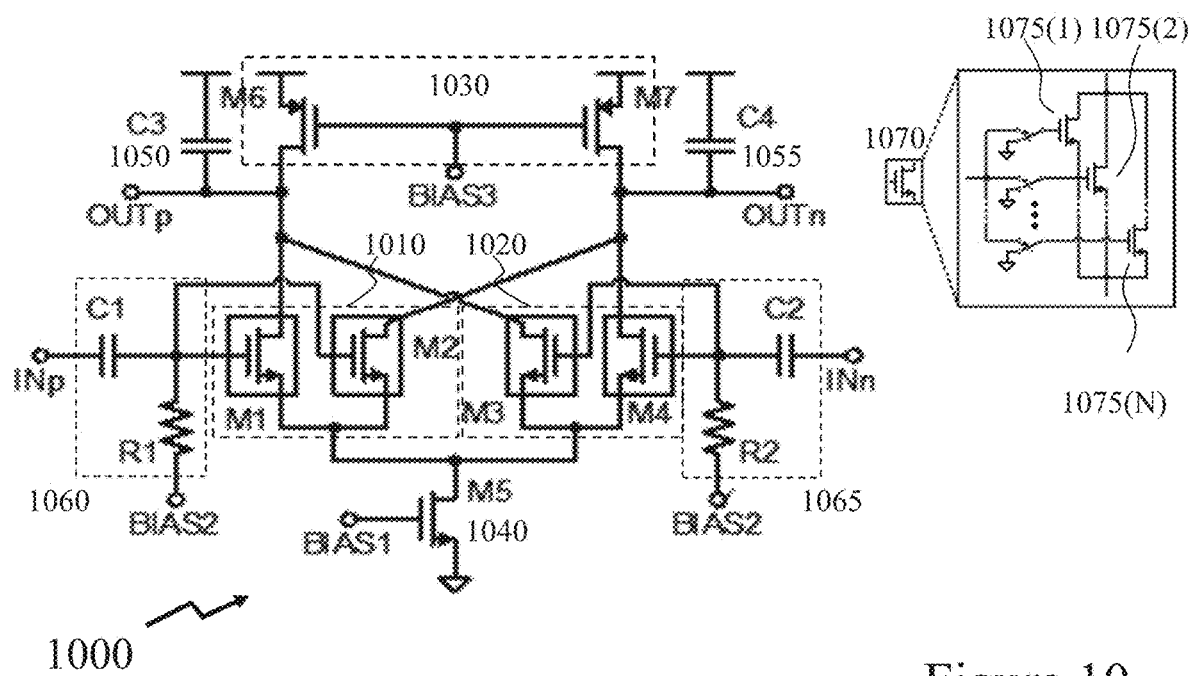
FIG. 10 depicts a variable gain amplifier circuit schematic for a UWB receiver/transceiver according to an embodiment of the invention.

A variable gain amplifier gain stage (VGA-GS) 1000 as depicted in FIG. 10 has been adopted within the embodiment of the invention presented within this specification and as such VGA-GS 1000 therefore represents an embodiment of each gain stage within the VGA 750 in FIG. 7. The differential input signals $IN_P$ and $IN_N$ are coupled to the gates of composite transistor pairs M1:M2 and M3:M4 respectively. Each composite transistor M1 to M4 as depicted in insert comprising a transistor array 1070 formed from an array of transistors 1075(1) to 1075(N) with connected sources and drains, and whose gates can be connected to either the signal or to ground depending on the switch positions. Accordingly, the composite transistor pairs M1:M2 and M3:M4 have switchable transconductance. The effective transconductance on the positive side ($OUT_P$) is equal to the difference of the transconductance of M1 and M3, and on the negative side ($OUT_N$) is equal to the difference in transconductance between M2 and M4. Therefore, the gain can be adjusted by the switch positions in the composite transistors. Transistors M6 and M7 are biased as current source 1030 to maximize the output voltage gain. Capacitor C3 and C4 perform low-pass filtering at the output nodes, while capacitors C1 and C2 together with bias resistors R1 and R2 perform high-pass filtering at the input nodes. The VGA-GS 1000 therefore operates with an effective bandpass filter response.

E. Transmitter-Receiver Synchronization and Clocking

As discussed supra the receiver (Rx) and transmitter (Tx) of a UWB communications link are not synchronized to each other through distributed timing information unlike within some other wireless protocols. Accordingly, a requirement of each circuit is efficient synching between Tx and Rx in order to maintain the extremely aggressive duty cycling of the wireless impulse radios according to embodiments of the invention, thereby maintaining the energy efficiency inherent to impulse radio communications. Accordingly, the inventors have established a low latency transmitter/receiver synchronization method/algorithm using dedicated synchronization hardware, including a dual clock timer system for ultra-low sleep mode power consumption. This allows for efficient synching between Tx and Rx in order to maintain the extremely aggressive duty cycling of the radio, thus maintaining the energy efficiency inherent to impulse radio communications.

A multiphase clock baseband transceiver was designed in order to reduce clock frequency (e.g., 20 MHz instead of 200 MHz) and enhance power efficiency. Further, a parallelized ADC/integrator structure, DIGIPRO 1200 in FIG. 12A, was employed in order to allow for faster synchronization and enhanced interference detection. This structure allows for full signal observability during the receive timeframe. This structure also allows for dynamically changing modulation schemes (e.g. OOK, PPM) to improve robustness of communications based on the channel or regulatory environment.

E1. Low Power Clock Generator

Figure 11:
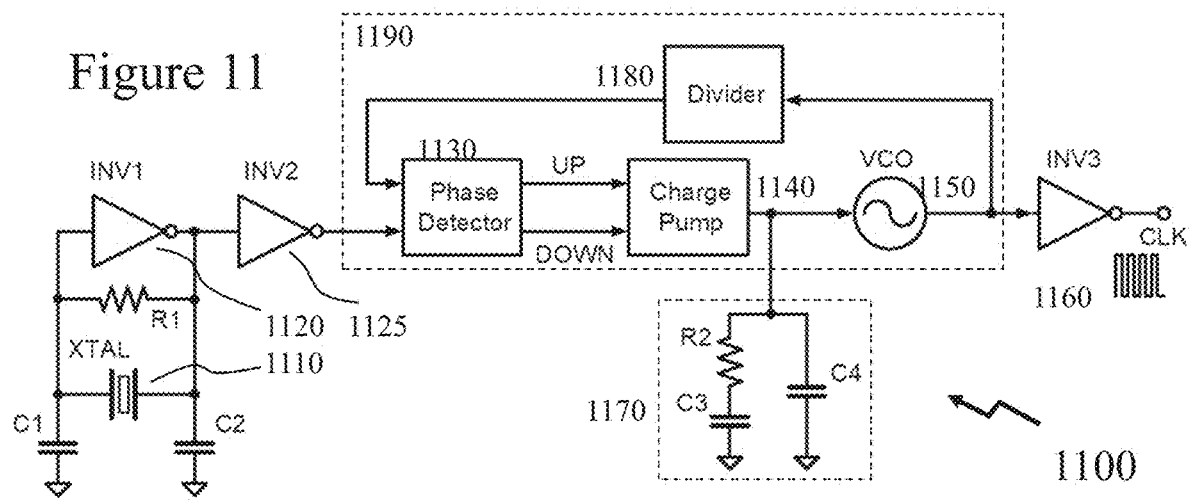
FIG. 11 depicts a clock generator circuit schematic for a UWB transmitter/receiver/transceiver according to an embodiment of the invention.

Referring to FIG. 11 there is depicted a first clock generator (CLKGEN1) 1100 which may be adopted within an embodiment of the invention presented within this specification and as such CLKGEN1 1100 provides the 20 MHz signal to the transmitter 300 as well to the DIGIPRO 1200 within receiver 700 in FIG. 7. The low-power clock generator, CLKGEN1 1100, comprises an inverter INV1 1120 which acts as a low frequency oscillator, i.e. 32 kHz, together with crystal XTAL 1110, resistor R1 and capacitors C1 and C2. The sinusoidal oscillator signal is amplified to a square wave clock by inverter INV2 1125 and used as the reference in a Phased Lock Loop (PLL) 1190. PLL 1190 consists of a Voltage Controlled Oscillator (VCO) 1150 whose output is divided in frequency by a Divider 1180 and compared to the reference by a Phase Detector 1130. Depending on whether the divided clock has lower or higher frequency than the reference, pulses on either DOWN or UP are generated. A Charge Pump 1140 together with resistor R2 and capacitors C3 and C4 filter the UP and DOWN signals into a control signal for the VCO. When locked, the loop generates an output clock buffered by inverter INV3 1160 that is an integer multiple of the reference clock.

As noted supra the efficient implementation of the clock generation and synchronization in an UWB transceiver is crucial for low power operation. With pulse durations on the order of nanoseconds, a conventional and straightforward synthesized digital approach would require a base clock of several hundreds of MHz or more, with high associated dynamic power consumption. Generating the base clock directly with a crystal clock generator would lead to a relatively high power consumption. Because crystal oscillator power scales directly with frequency, operating a crystal oscillator at much lower frequency (e.g. 32 kHz) and multiplying the frequency with a Phased Locked Loop (PLL) significantly reduces the power consumption. This strategy is exploited by the inventors for low power clock generation in the UWB transceiver. The base clock for the digital logic is set to the symbol frequency, e.g. 20 MHz, which is the rate that symbols are processed by the digital baseband hardware and is generated by a clock generator such as CLKGEN1 1100 in FIG. 11 which exploits lower power low frequency oscillator XTAL 1110. Then as depicted in respect of transmitter 300 in FIG. 3 the 20 MHz clock is coupled to a delay locked loop (DLL) 330 that derives multiple phases from this clock at nanosecond range intervals, which are used as a timing basis to generate the symbol pulses in conjunction with Multiplexer 320, DCO 340 and Pulser 350. The pulse generator control signals are generated by a multiplexer, which selects the control bits from a memory, Pulse Pattern 310, on the edges of the DLL multiphase clock.

The PLL 1190 has a startup time in the millisecond range, which is effectively limited by the number of crystal oscillator cycles required to stabilize the loop. At data rates higher than 50 kbps the PLL 1190 and DLL 330 remain ON between frames, and have been optimized for low power consumption. At data rates of 50 kbps or lower, both the PLL 1190 and DLL 330 can be power cycled in between frames such that the only power consumption during sleep mode is from the crystal oscillator.

E2. Synchronization

Figure 12A:
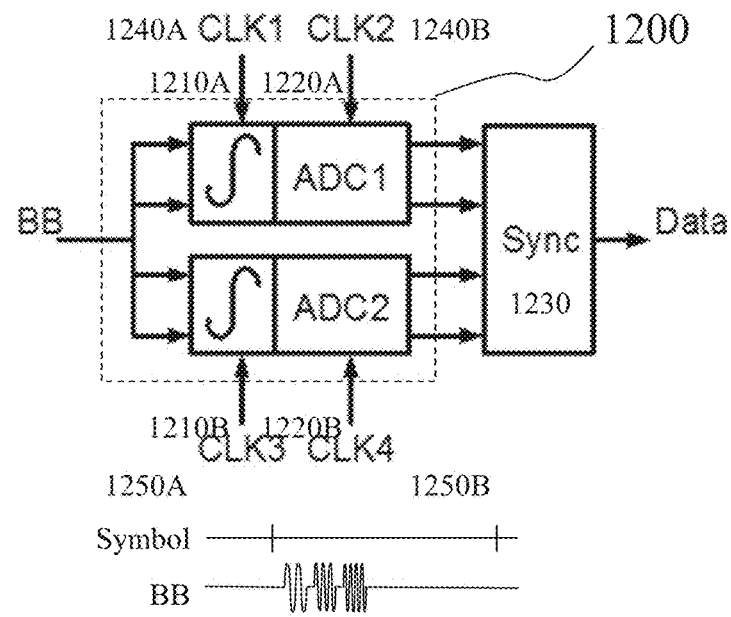
FIGS. 12A and 12B depict an integrator/analog-to-digital synchronization circuit schematic for a UWB receiver/transceiver according to an embodiment of the invention.
Figure 12B:
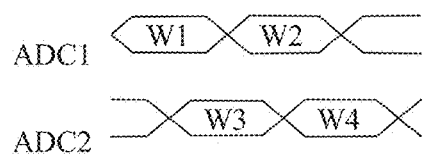

It would be evident that synchronization of the receiver clock is required as the transmission methodology of the UWB links has no clock data transmitted. Accordingly, as depicted in respect of FIG. 12 a synchronization block 1230 is employed in conjunction with DIGIPRO 1200 of the receiver 700 depicted in FIG. 7. As depicted in FIG. 12A the DIGIPRO 1200 comprises a pair of double-edge-triggered integrator and Analog-to-Digital Converter (ADC) blocks. Each of the first and second integrators 1210A and 1210B integrates over half the symbol period and its output is digitized with one of the first and second ADCs 1220A and 1220B. The first and second integrators 1210A and 1210B respectively are clocked via CLK1 1240A and CLK3 1250A whilst the first and second ADCs 1220A and 1220B are clocked via CLK2 1240B and CLK4 1250B respectively. Each of the first and second integrators 1210A and 1210B respectively may be a 3-bit flash ADC, for example. The two integrator-ADC blocks are offset by a quarter symbol period such that a total of four overlapping integration windows are available during each symbol. This being evident in FIG. 12B.

Synchronization during the synchronization frame block is achieved by determining the integration window with maximum energy such that clock synchronization of the receiver can thus in principle be achieved with one synchronization symbol. Additional synchronization symbols are needed in practice to account for the variable gain loop that tracks changes in the channel of the wireless link. PPM demodulation is achieved by observing the integration window with maximum energy for each symbol, and OOK modulation is achieved by observing the energy in a fixed integration window.

F. N-Path Filter with Energy Detector

As depicted in FIG. 7 an exemplary UWB receiver 700 according to an embodiment of the invention was depicted wherein the RF signal from the antenna 710 is initially amplified by a Low Noise Amplifier (LNA) 720 before being passed to a two stage RF amplifier (AMP1) 730. A first squaring mixer (MIX1) 740 multiplies the signal with itself to convert to the Intermediate Frequency (IF) before a three-stage Variable Gain Amplifier (VGA) 750 amplifies the signal further. The VGA 750 output is then coupled to a second squaring mixer (MIX2) 760 which down-converts the signal to the baseband frequency wherein a parallel integrator (INT1 and INT2) sums the signal energy, which is digitized by the Analog-to-Digital Converters (ADC1 and ADC2) within a digital processor.

The squaring mixer (MIX2) 760, hereinafter referred to as a squarer, performs a squaring of the signal amplitude which when integrated by the parallel integrator yields the instantaneous energy of the signal received. Integrating for a fixed time period yields the total energy of the symbol within that time period. However, the input signal must be filtered so that it is limited to the band of interest in order to reduce both noise and the integrated energy of any interfering signals. Within the exemplary UWB receiver in FIG. 7 the VGA 750 provided this though appropriate design to provide a bandpass filtering function. However, it would be beneficial to separate the amplification and filtering functions allowing independent optimization of each whilst not substantially impacting the power consumption as well as allowing for bandstop filters as well as bandpass filters.

Within the prior art filters typically present circuit designers with a high power consumption and a low quality factor, especially if an Intermediate Frequency (IF) bandpass filter is required. Accordingly, the inventors have established a design methodology based upon combining a switched-capacitor N-path filter prior to the squarer. N-path filters as will become evident can be bandpass or bandstop filters and are based on the up- and down conversion of a low pass filter in a passive mixer structure. The quality factor can be high as the low pass filter is up-converted to a higher frequency and the center frequency is tunable by ways of the clock frequency. However, a disadvantage of an N-path filter is the high power consumption in the clock generator required to produce a high quality clock in synchronous receiver structures. This makes this technology usually not well suited to low-power applications within the prior art.

However, the inventors have established a means to circumvent the disadvantages of the N-path filter in terms of clock jitter, such that a low power clock generator can be used for the N-path filter rather than the prior art high power high accuracy (low jitter) clock generators associated with N-path filters. The effect of clock jitter is to spread the energy of the input signal over a larger bandwidth, which would reduce the in-band energy in a synchronous receiver. However, within an exemplary UWB receiver according to an embodiment of the invention when the N-path filter is paired with an asynchronous receiver, e.g. an energy detector such as the one depicted in FIG. 9, then the total signal energy is still captured as the energy detector is insensitive to the frequency spread of the N-path filter timing clock.

This technique may also be extended to systems which use a squarer as a self-mixer, for example to down-convert a signal around DC. In this scenario the selectivity of the squarer is improved by the N-path filter but without consuming much power as the clock generator can exhibit a relaxed amount of jitter.

F.1 Exemplary Implementation

Figure 13A:
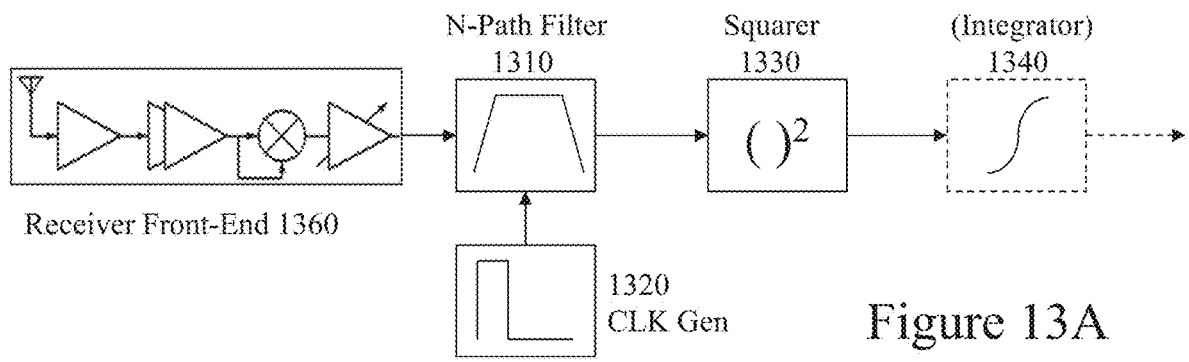
FIG. 13A depicts a system overview of a UWB receiver according to an embodiment of the invention exploiting an N-path bandpass filter.
Figure 13B:
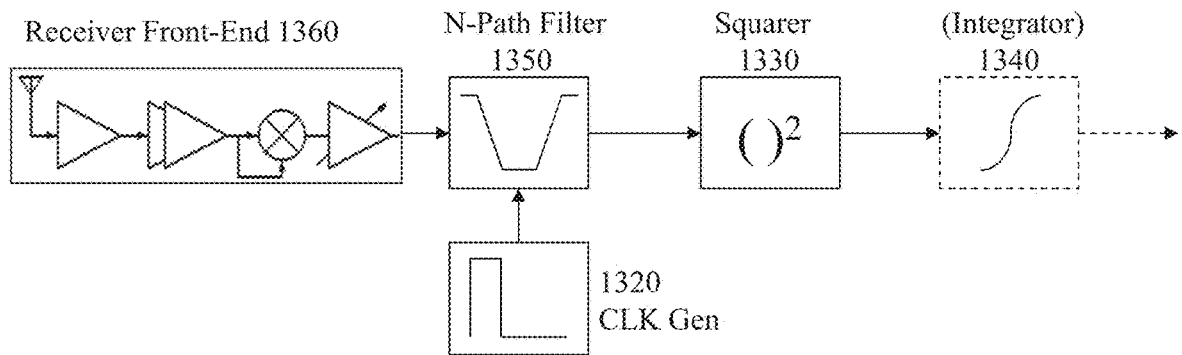
FIG. 13B depicts a system overview of a UWB receiver according to an embodiment of the invention exploiting an N-path bandstop filter.

Referring to FIGS. 13A and 13B there are depicted exemplary implementations of the invention for both bandpass and bandstop variants. Considering FIG. 13A then a receiver front-end 1360, e.g. comprising antenna, LNA, RF amplifier, a first squaring mixer which multiplies the signal with itself to convert to the Intermediate Frequency (IF) before a VGA amplifies the signal further. The output of the VGA is coupled to the N-path filter 1310 which is driven by clock generator (CLK Gen) 1320 wherein the output of the N-path bandpass (NP-BP) filter 1310 is then coupled to a squarer 1330 and thereafter subsequent receiver circuitry including integrator 1340 for example. In FIG. 13B the same overall receiver circuit configuration is depicted but the N-path bandpass filter 1310 is replaced with N-path bandstop filter (NP-BS) 1350.

Figure 14:
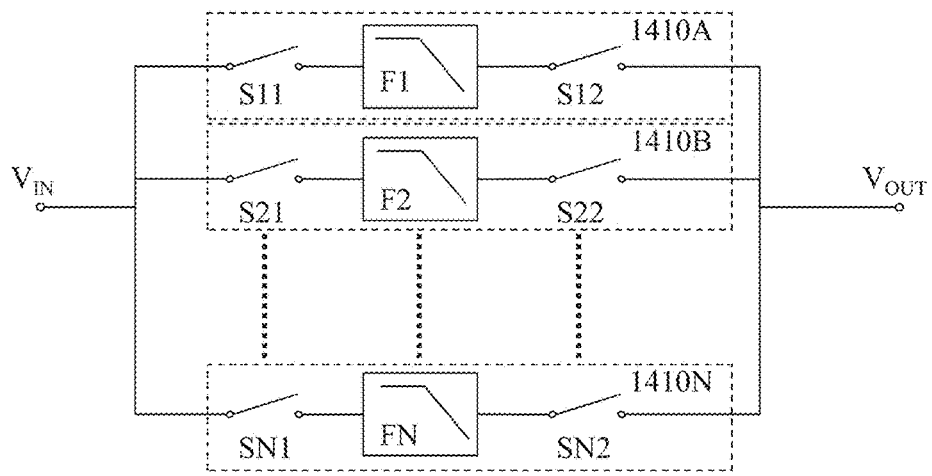
FIG. 14 depicts a simplified block circuit representation for an N-path filter exploiting bandpass filtering.

FIG. 14 depicts an exemplary design of a NP-BP 1310 according to an embodiment of the invention wherein the received signal to be filtered, $V_{IN}$, is coupled to N paths 1410A to 1410N respectively. Each path comprising an input switch $S_{X1}$ (X=1, 2, ..., N), a filter $F_X$ (X=1, 2, ..., N), and an output switch $S_{X2}$ (X=1, 2, ..., N). The outputs from the N paths 1410A to 1410N respectively being combined to provide the filtered output, $V_{OUT}$. Filter $F_X$ may be a lowpass or a bandpass filter.

Figure 15A:
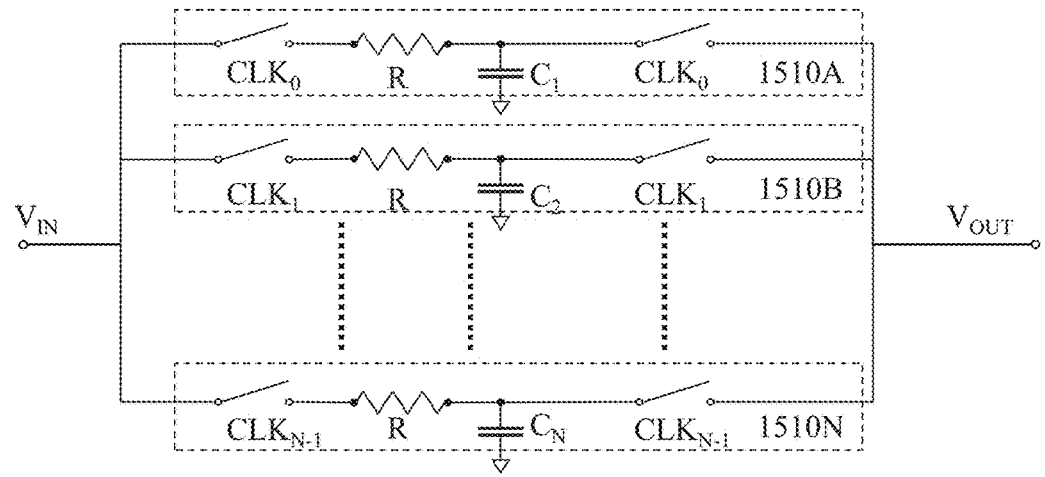
FIG. 15A depicts an embodiment of the generalized circuit representation for an N-path filter exploiting bandpass filtering depicted in FIG. 14.
Figure 15B:
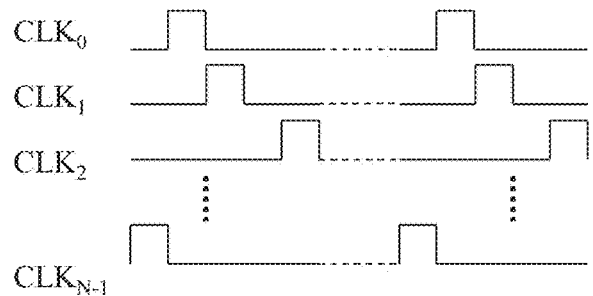
FIG. 15B depicts a time representation of the clock signals for the embodiment of the generalized circuit representation depicted in FIG. 15A.
Figure 15C:
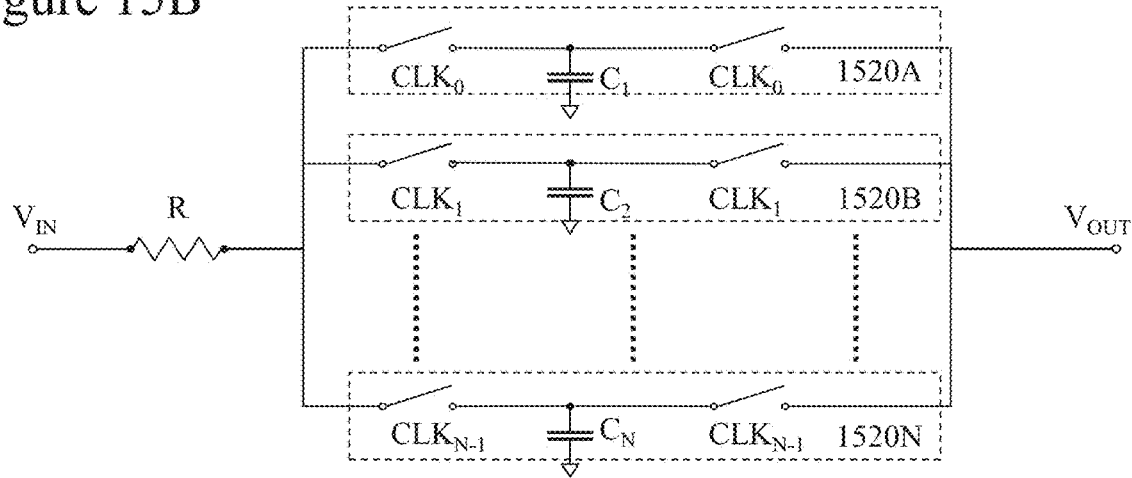
FIG. 15C depicts a variation of the embodiment of the generalized circuit representation depicted in FIG. 15A removing N−1 resistor elements.
Figure 16:
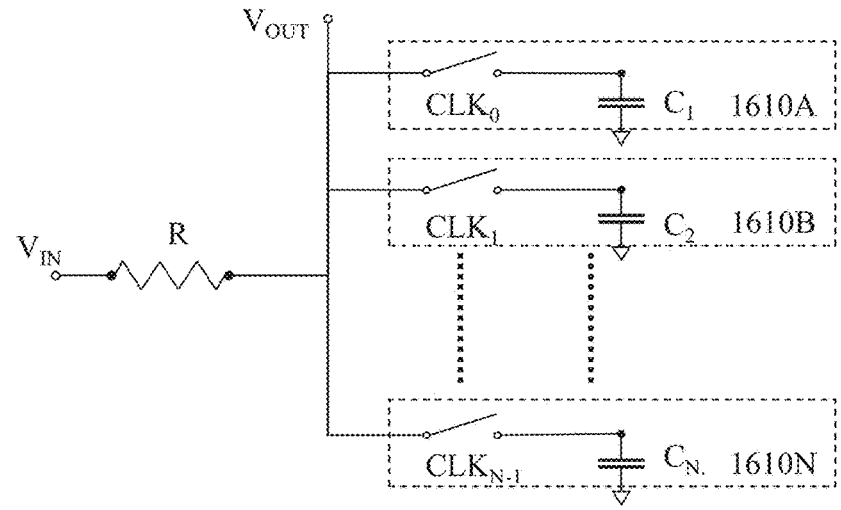
FIG. 16 depicts a variation of the embodiment of the generalized circuit representation depicted in FIG. 15A reducing the number of switches by N and making the circuit a single-sided design.

The NP-BP depicted in FIG. 14 is depicted in FIG. 15A wherein there is now denoted the clock signals applied to each electrical switch and exemplary RC filter designs for the individual filters $F_X$. As depicted the input and output electrical switches are driven within each NP-BP 1510A to NP-BP 1510N respectively are driven by the same clock signals. NP-BP 1510A with $CLK_0$, NP-BP 1510B with $CLK_1$ etc. to BP-NP 1510N with $CLK_{N-1}$. Between each pair of switches are an RC filter comprising a resistor R in series between the pair of switches and a capacitor $C_X$ (X=1, 2, ..., N) in parallel to ground. The clock signals are depicted in FIG. 15B whilst FIG. 15C depicts a first implementation simplification wherein a single resistor R is now disposed before the split into N paths. FIG. 16 depicts a further implementation simplification wherein the NP-BP is implemented as a single-sided design. Accordingly, the input is coupled to the N-paths which comprise a single switch driven by its clock signal $CLK_Y$ (Y=0, 1, ..., N−1) and associated capacitor $C_X$ (X=1, 2, ..., N). The output is now the common point between all the N-paths and the input.

Figure 17:
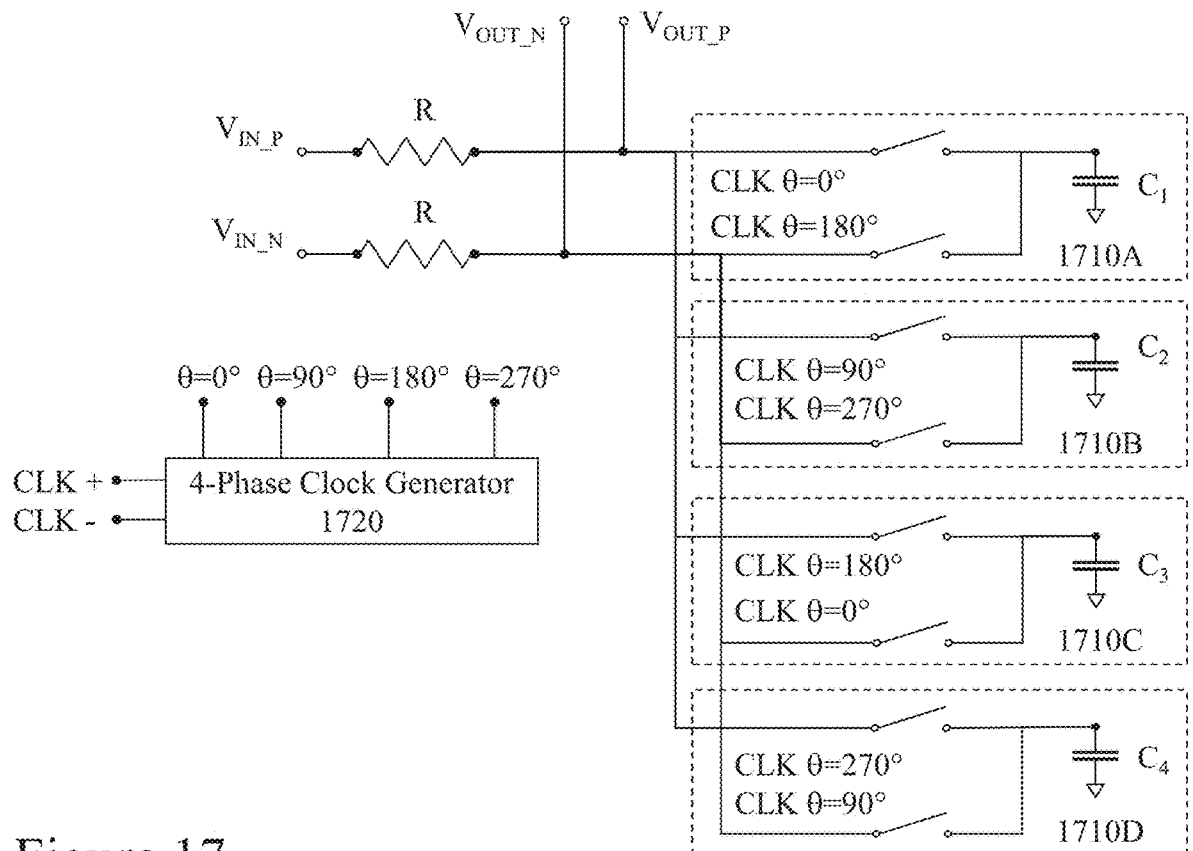
FIG. 17 depicts a differential circuit variation of the embodiment of the generalized circuit representation depicted in FIG. 16.

An exemplary implementation for the squarer 1330 is depicted in FIG. 9 with squaring mixer (SQ-MIX) 900. This is a differential squarer implementation and accordingly can be coupled to a differential N-path filter such as depicted in FIG. 17. Accordingly, there are depicted a pair of NP-BP single sided filters such as depicted in FIG. 16 each comprising an input resistor R with the N switches and capacitors. Within FIG. 17 N=4 so that four parallel paths 1710A to 1710D are depicted with capacitors $C_1$; $C_2$; $C_3$; $C_4$ wherein the differential circuits now employ a single capacitor coupled to each differential input by its switch. These switches are driven by the appropriate phases of the clock signal, denoted as $CLK(\theta=0°)$; $CLK(\theta=90°)$; $CLK(\theta=180°)$; $CLK(\theta=270°)$. These clocks being generated by a 4-Phase Clock Generator 1720 from differential clocks coupled to it from a clock generator circuit.

Figure 18:
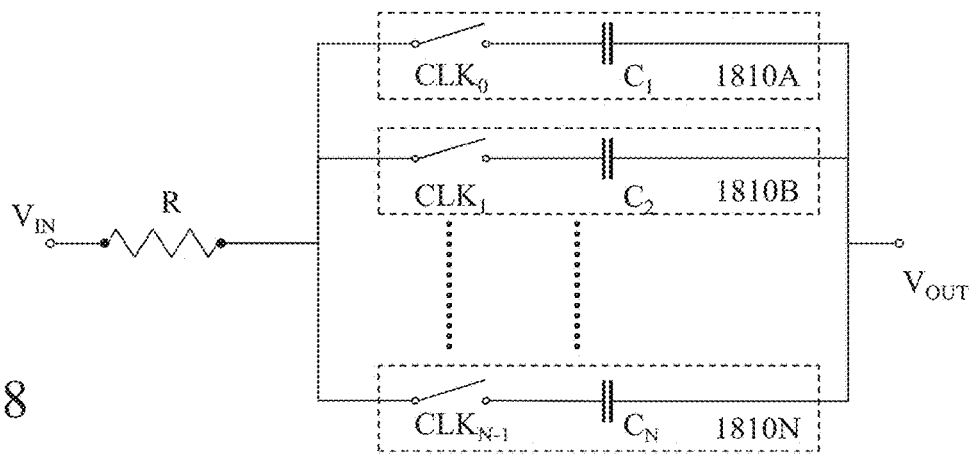
FIG. 18 depicts an embodiment of the generalized circuit representation for an N-path filter exploiting bandstop filtering depicted in FIG. 14.

FIG. 18 depicts the equivalent bandstop filter design to that depicted in FIG. 16 wherein the bandstop filters now comprise the capacitors $C_X$ (X=1, 2, ..., N) in series with the resistor R.

G. Ranging and Positioning with UWB Impulse Radios

As noted supra range finding and location/positioning measurements are one aspect of many applications with devices/sub-systems/systems/components etc. employing UWB transceivers. Absent exploiting a UWB based technique within such devices/sub-systems/systems/components etc. additional hardware functionality must be provided together with associated power consumption etc. to achieve the desired range finding and location/positioning measurements with another wireless technology, e.g. optical/RF/microwave based locally for internal applications of those covering both internal/external environments, or global positioning systems (GPS)/wireless triangulation etc. in external environments with microwave/RF wireless systems such as Bluetooth, Wi-Fi, WiMAX etc.

Accordingly, the inventors have established two techniques exploiting the low power pulse based UWB transmitters/receivers/transceivers developed by them within this patent application together with those described and depicted within WO/2016/191851 "Systems and Methods for Spectrally Efficient and Energy Efficient Ultra-Wideband Impulse Radios with Scalable Data Rates" and WO/2015/103692 "Systems relating to Ultra-Wideband Broadcasting comprising Dynamic Frequency and Bandwidth Hopping", both of which are incorporated herein by reference.

F.1 Time of Flight Range Finding (Synchronised UWB Transceiver Pair)

This range finding system is described with respect to a UWB communications link and exploits an innovative energy detection scheme in combination with an exemplary 20 Mbps over-the-air data rate. The capabilities of the UWB transceivers advanced synchronization scheme is exploited to ensure robust communications and tracking of the pulse bundles, and the ranging scheme is used to "zoom-in" on the time of arrival.

Figure 19:
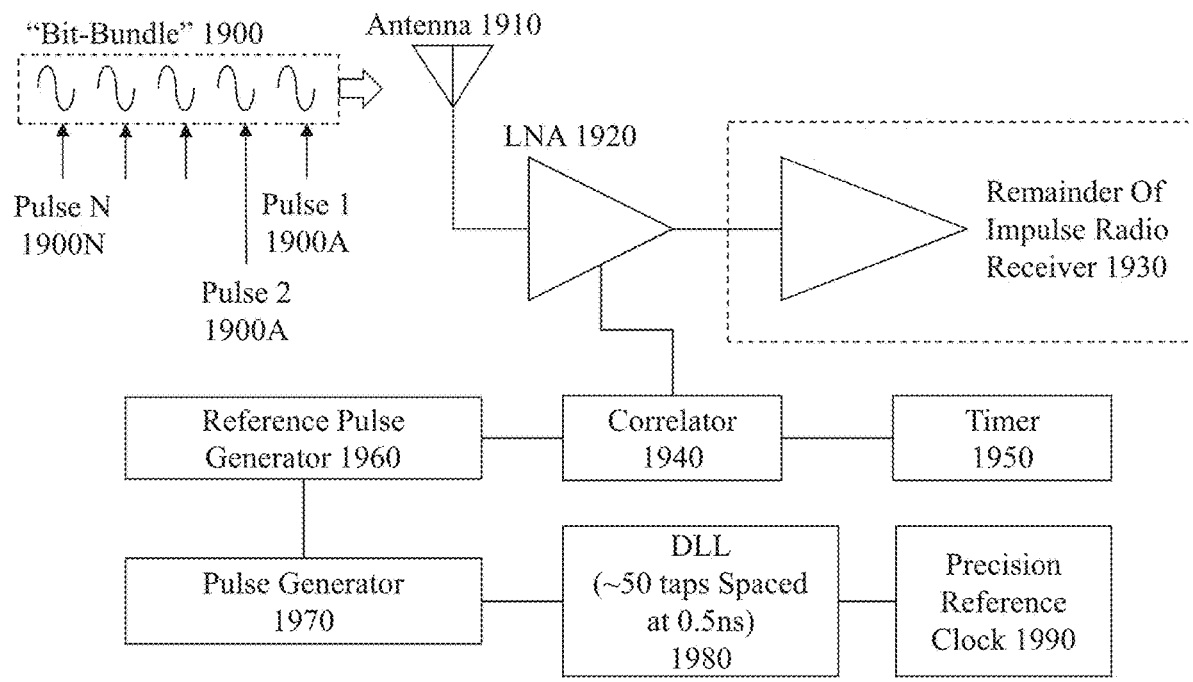
FIG. 19 depicts a simplified block circuit receiver representation of a ranging extension to a UWB receiver according to an embodiment of the invention.

In addition to the UWB transceiver/receiver an integrated circuit (IC) implementation or hybrid implementation requires the ranging circuit as described and depicted according to FIG. 19. According to the desired ranging estimation tolerance/accuracy a higher accuracy timing reference may be required to enable ranging estimations in the centimeter range.

A simplified version of the system block diagram and a simplified pulse train is shown in FIG. 19. An incoming pulse train passes post-antenna 1910 passes through a Low Noise Amplifier (LNA) 1920. A portion of the amplified received signal is coupled to a Correlator Circuit 1940 which the remainder propagates to the remainder of the receiver front end circuitry 1930. The Correlator Circuit 1940 correlates the received signal with a reference pulse provided by a Reference Pulse Generator 1960 which is driven by a Pulse Generator 1970. The Pulse Generator 1970 is itself driven through a Delay-Locked Loop (DLL) 1990 which has approximately 50 taps spaced at 0.5 ns for a nominal 20 Mb/s UWB scheme according to embodiments of the invention established by the inventors. The DLL 1980 is driven by a Precision Reference Clock 1990. The output from the Correlator Circuit 1940 is fed to a timer circuit.

Due to the construction of the pulse bundle only one pulse within the incoming pulse train will match the reference (or template) pulse because all of the pulses in the pulse train have a different center frequency. This means the UWB energy detector receiver, such as depicted and described supra in respect of embodiments of the invention, may still derive the benefit of integrating the energy of the full pulse train to increase communications distance, whilst the ranging portion can "zoom-in" on a single pulse to increase timing resolution.

The exemplary process according to an embodiment of the invention will start at tap #1, and the tap will be advanced after each pulse bundle until a correlation peak is established. Since the energy detection receiver already knows the "location" of the pulse bundle to within 25 ns, the search space is drastically reduced. This leads to a significant reduction in the hardware complexity, search time, etc.

F1.1 Time of Flight Algorithm

Figure 21:
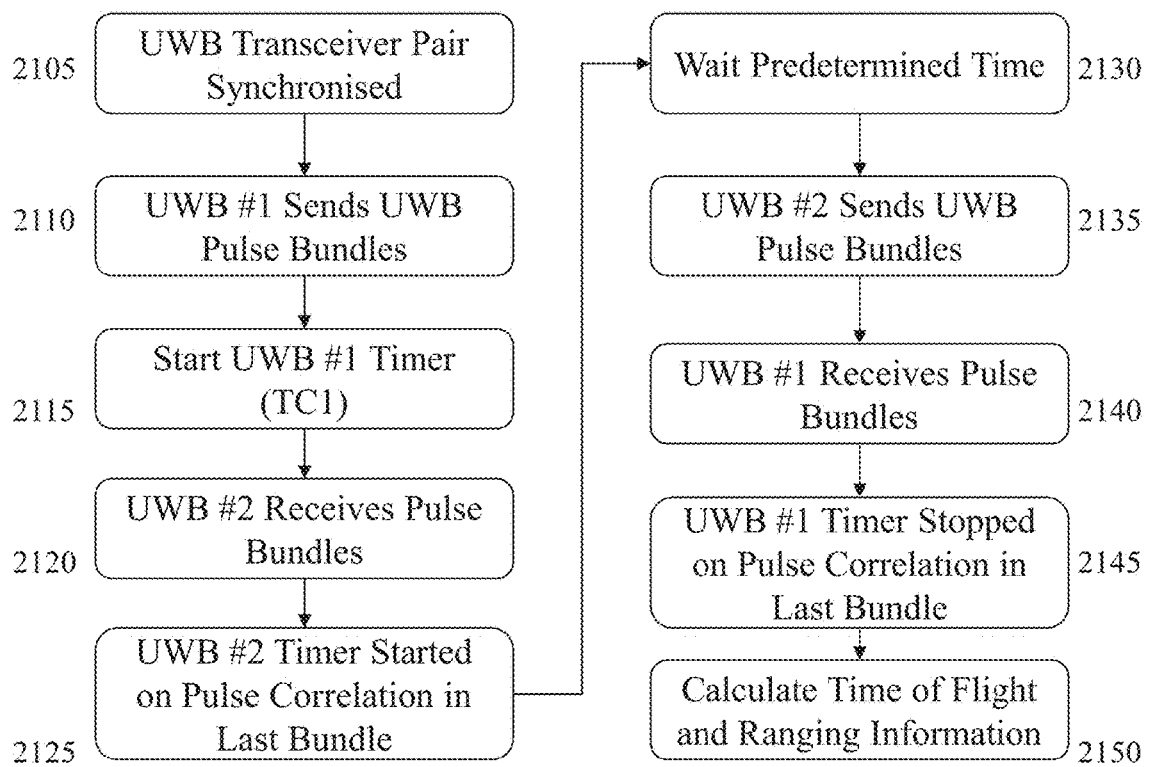
FIG. 21 depicts an exemplary process flow for a first range finding operation mode according to the embodiment of the invention depicted in FIG. 20.
Figure 20:
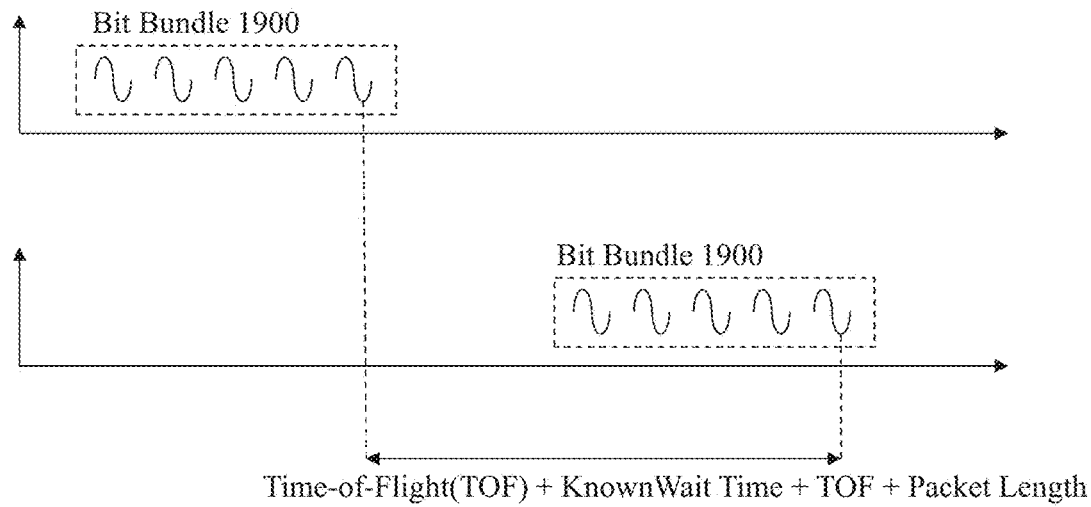
FIG. 20 depicts a simplified timing diagram for a first range finding operation mode of a UWB receiver according to an embodiment of the invention such as that depicted in FIG. 19.

It is important to note that this exemplary algorithm according to an embodiment of the invention assumes that the pair of UWB transceivers are already synchronized. A simplified timing diagram is depicted in FIG. 20 for reference whilst FIG. 21 depicts an exemplary process flow for the algorithm according to an embodiment of the invention. It would be evident to one of skill in the art that many variations on this exemplary algorithm are possible. The fundamental accuracy relies on the precision of the reference that is available in the transceivers, and sub-nanosecond level accuracy/drift is advisable.

Now referring to FIG. 21 then the process comprises steps 2105 to 2150. Steps 2105 to 2125 depict:

Step 2105: Synchronise the UWB transceiver pair (UWB #1 and UWB #2);

Step 2110: UWB Chip #1 sends a packet composed of UWB pulse bundles;

Step 2115: UWB Chip #1 Timer (TC1) is started during transmission of the last pulse bundle;

Step 2120: UWB #2 receives the packet and Correlator Circuit 1940/DLL Circuit 1990 synchronises to the appropriate pulse; and Step 2125: UWB #2 starts timer when the synchronized pulse within the last bundle is received.

Subsequently steps 2130 to 2150 are executed comprising:

Step 2130: UWB #2 waits a precise time that is known to both transceivers. (NOTE: Chip #2 knows when the last bundle occurs because the packet length is known.)

Step 2135: After the precise wait time Chip #2 transmits the same type of packet back to Chip #1;

Step 2140: Wherein Chip #1 performs the same synchronization process is carried out;

Step 2145: Chip #1 determines that the last bundle in the packet arrives, and stops its TC1 timer, yielding an elapsed time, $TC1_{ELAPSE}$; and Step 2150: Chip #1 determines the time of flight (TOF) based upon Equation (1) below and according the ranging distance.

$$TC1_{ELAPSE} = TOF + KnownWaitTime + TOF + PacketLength \quad (1)$$

Optionally, Chip #1 can stop its timer as soon as the correlator detects the appropriate pulse, and instead of using "packet length" in the TOF calculation, it can use "number of bundles before correlation". This will reduce timing errors, and the number of bundles will be known from the transceiver's bit counter.

Steps 2110 to 2150 may be repeated to provide averaged results with improved accuracy. However, optionally the length of the packet can be reduced since the pair of transceivers already know approximately which DLL tap to use. Accordingly, shorter packets would mean there is less drift in the clocks between the UWB transceivers.

F.2 Integration Time Window Range Finding (Unsynchronised UWB Transceiver Pair)

According to an embodiment of the invention a pair of UWB circuits, Chip #1 and Chip #2, can each send UWB impulses which can be repeated based on the internal clock of the respective chip. Both Chip #1 and Chip #2 can receive the UWB impulses from the other UWB circuit's transmitter. The UWB circuits according to a method according to an embodiment of the invention recognize the arrival of the UWB impulse by integrating the input signal energy within integration time windows, which are defined as PW1 and PW2 for Chip #1 and Chip #2, respectively. These integration windows are based on the internal clock of each chip and Chip #1 has a slightly different internal clock than Chip #2, such that PW2 is a bit longer than PW1. Accordingly, the two chips must not be synchronized.

Figure 22:
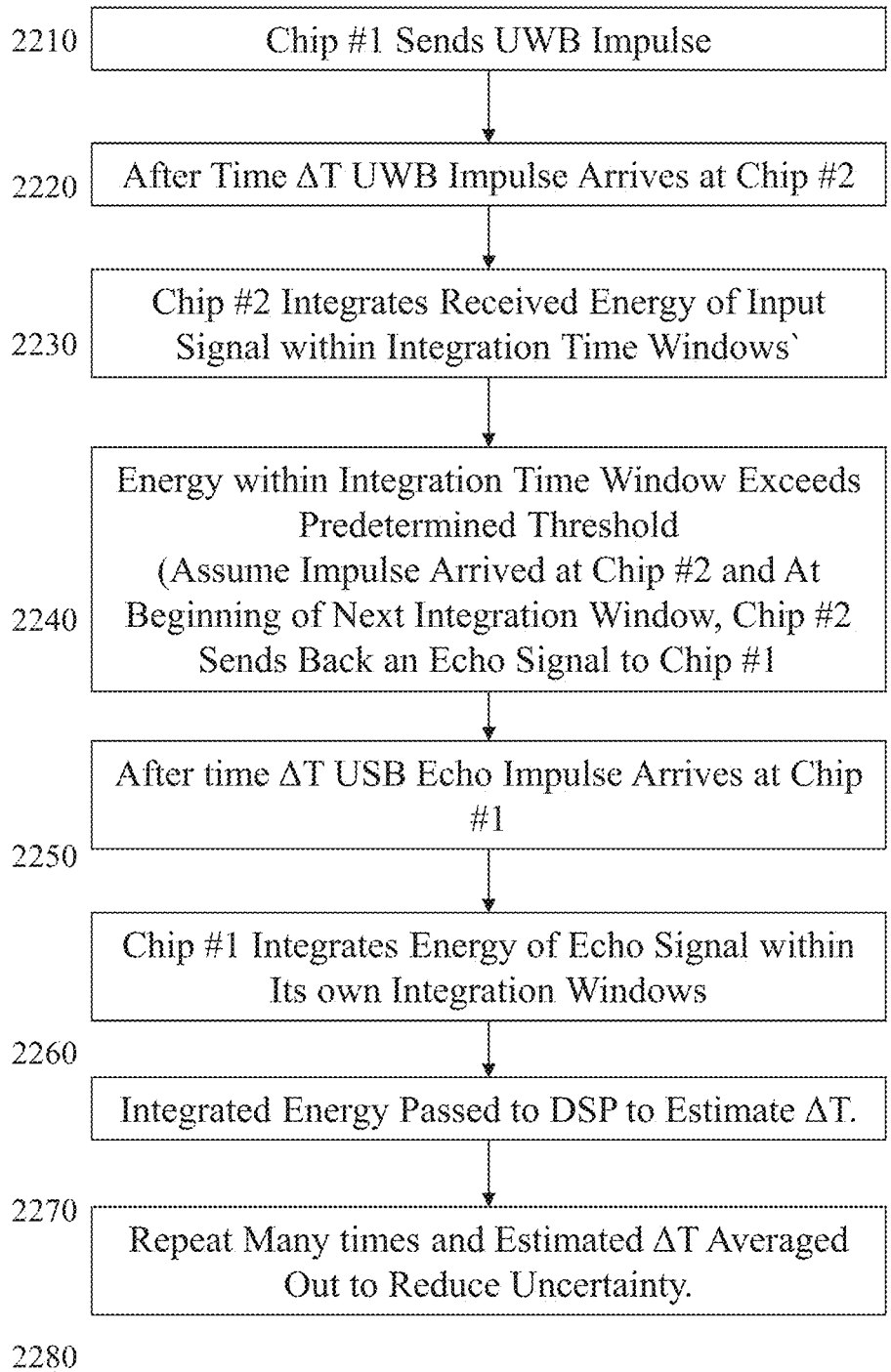
FIG. 22 depicts an exemplary process flow for a second range finding operation mode according to an embodiment of the invention.
Figure 23:
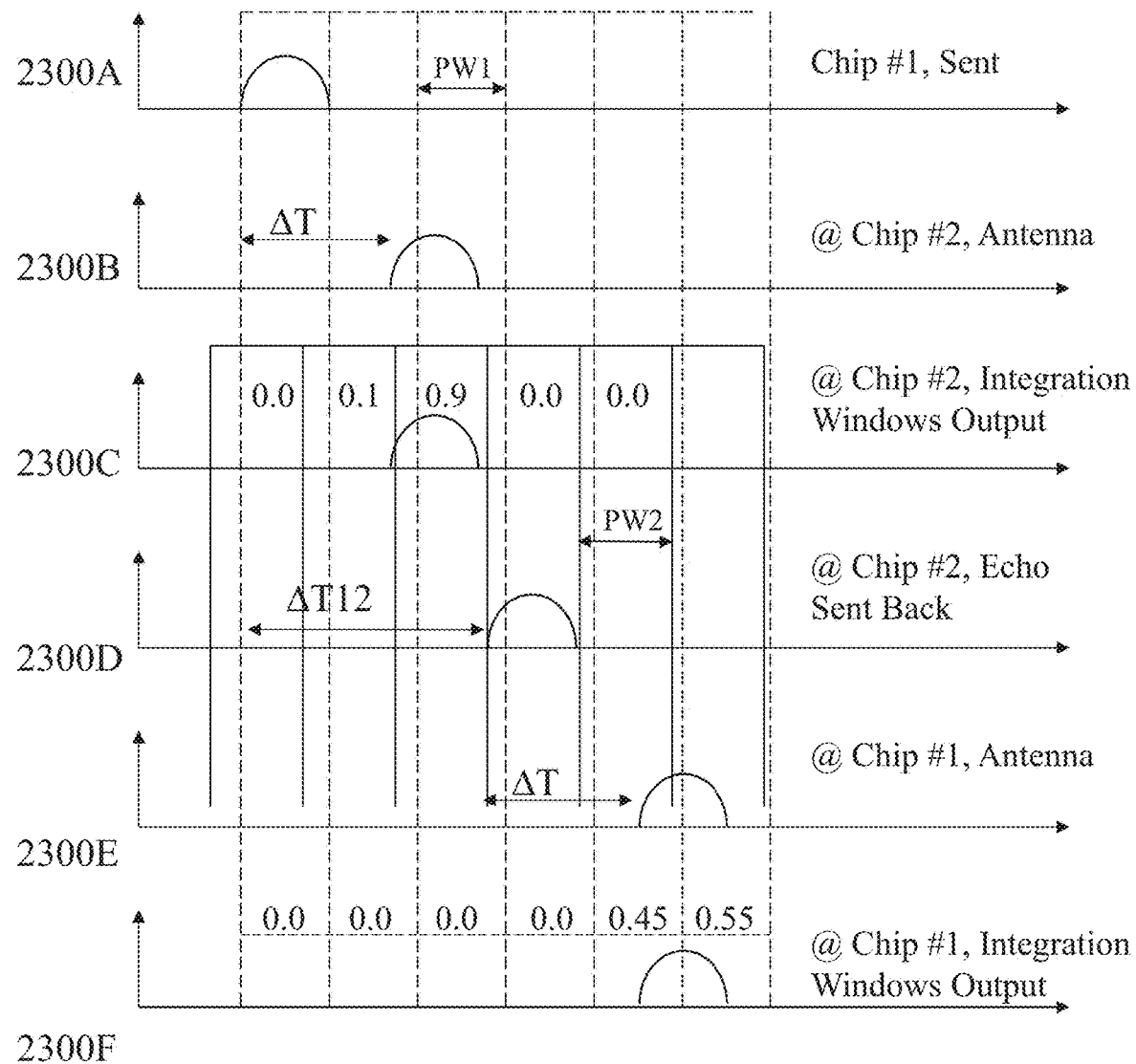
FIG. 23 depicts a simplified timing diagram for the second range finding operation mode of a UWB receiver according to an embodiment of the invention such as that depicted in FIG. 22.

Referring to FIG. 22 there is depicted an exemplary process flow for the integration time window method of range finding wherein the timing diagram is depicted in FIG. 23.

The algorithm comprises steps 2210 to 2280 which are:

Step 2210: Chip #1 sends an UWB impulse (First Timing 2300A in FIG. 23 depicts this impulse energy versus time);

Step 2220: After time ΔT (which is proportional to the distance between two chips), the impulse arrives at Chip #2 (Second Timing 2300B in FIG. 23);

Step 2230: In order to detect this impulse, Chip #2 integrates the energy of the input signal within integration time windows (Third Timing 2300C in FIG. 23)

Step 2240: If the energy within an integration time window is greater than a threshold, it is assumed that the impulse is arrived at Chip #2 and in the beginning of its next integration window, Chip #2 sends back an echo signal to Chip #1 (Fourth Timing 2300D in FIG. 23);

Step 2250: After time ΔT this echo impulse arrives at Chip #1 (Fifth Timing 2300E in FIG. 23);

Step 2260: Chip #1 integrates the energy of the input signal within its own integration windows (Sixth Timing 2300F);

Step 2270: This integrated energy is then passed to a digital signal processor (DSP), which is combined with Chip #1, in order to estimate ΔT; and Step 2280: Steps 2210 to 2270 may be repeated many times and the estimated ΔT is averaged out to reduce its uncertainty.

F.2.1 Time of Flight by Digital Signal Processing:

Within many ranging algorithms the time difference (ΔT) between the transmitted signal and the received echo is used to measure the time of flight (TOF) of the signal. This time of flight is proportional to the distance between the transmitter and the echo generator. However, within the proposed algorithm presented below the time difference is not measured directly but is derived through a digital signal processing algorithm. This algorithm exploits the fact that when an echo signal is received, its energy is distributed between two consecutive integration time windows, as shown in sixth graph 2300F in FIG. 23. The exact time of arrival of the echo signal can be estimated by processing the proportion of energy that is integrated in each of these two time slots, referred to as E1 and E2 respectively. For example, if the energies are equal, i.e. E1=E2, then this means that the signal arrived at exactly the middle of the first time slot. Using a linear approximation, it can be shown that the estimated time of arrival is given by Equation (2) where PW1 is the width of the timeslot.

$$\Delta TOA = T_{BEGIN\_FIRST\_TIMESLOT} + \frac{E_2}{E_1 + E_2} PW1 \quad (2)$$

Accordingly, the time difference ΔTOA is exactly measured and this time should be related to ΔT. As shown in FIG. 23, this time difference ΔTOA consists of two time slots: the time between the transmitted signal and the echo signal (ΔT12) and the echo signal of chip #2 and the received signal at chip #1 (ΔT).

Calculation of ΔT12: If the received signal at chip #2 (third graph 2300C in FIG. 23) exactly arrives at the beginning of an integration time window, ΔT12 is equal to ΔT+PW2, otherwise it is a random variable with a uniform distribution between ΔT+0.5·PW2 and ΔT+1.5·PW2, due to the non-synchrony between chip #1 and chip #2. Hence, ΔTOA has a mean value of 2×ΔT+PW2. Therefore, by repeating the algorithm, measuring ΔTOA for many samples, and averaging it, ΔT can be estimated.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method comprising:
    filtering an ultra-wideband (UWB) signal received by a UWB receiver with a filter;
    wherein
    the filter comprises:
        an N-path filter for receiving the UWB signal;
        a low precision clock source coupled to the N-path filter; and
        an energy detector coupled to the output of the N-path filter; wherein
    the N-path filter has one of a first configuration, a second configuration, and a third configuration;
    in the first configuration the N-path filter comprises:
        N parallel paths, each path comprising:
            a first electrical switch disposed between an input port of the N-path filter and an input of a filter having predetermined frequency characteristics; and
            a second electrical switch disposed between an output of the filter having predetermined frequency characteristics and the output port of the N-path filter;
        the first electrical and second electrical switch in each path of the N parallel paths are driven by a clock signal of a plurality of clock signals derived from a clock generated by the low precision clock source;
        the plurality of clock signals are each offset relative to one another; and
        each filter comprises a resistor in series between the first electrical switch and the second electrical switch and a capacitor in parallel to ground between the first electrical switch and the second electrical switch;
    in the second configuration the N-path filter comprises:
        N parallel paths, each path comprising:
            a first electrical switch disposed between a resistor and an input of a filter having predetermined frequency characteristics; and
            a second electrical switch disposed between an output of the filter having predetermined frequency characteristics and the output port of the N-path filter;
        the resistor disposed between the input port of the N-path filter and each first electrical switch of the N parallel paths;
        the first electrical and second electrical switch in each path of the N parallel paths are driven by a clock signal of a plurality of clock signals derived from a clock generated by the low precision clock source;
        the plurality of clock signals are each offset relative to one another; and
        each filter comprises a capacitor in parallel to ground between the first electrical switch and the second electrical switch; and
    in the third configuration the N-path filter comprises:
        N parallel paths, each path comprising an input port coupled to a first electrical switch which is disposed between a first end of a resistor and an input of a filter having predetermined frequency characteristics;
        the input port of the N-path filter is coupled to a second distal end of the resistor;
        the first electrical switch in each path of the N parallel paths is driven by a clock signal of a plurality of clock signals derived from a clock generated by the low precision clock source;
        the plurality of clock signals are each offset relative to one another;
        each filter comprises a capacitor coupled to ground;
        the output port of the N-path filter is electrically coupled to the first end of the resistor; and
    at least one of:
        the energy detector is insensitive to frequency spread of the low precision clock source; and
        the UWB signal received by the UWB receiver comprises a plurality of symbol pulse bundles where each symbol pulse bundle represents a current symbol of a data signal and each symbol pulse bundle comprises a plurality N pulses; wherein each pulse of the N pulses is at a predetermined frequency of a plurality M frequencies, has a predetermined amplitude, and has a predetermined pulse length.

2. The method according to claim 1, wherein the energy detector comprises a squaring circuit in combination with an integrator.

3. The method according to claim 1, wherein the N-path filter is a bandpass filter.

4. The method according to claim 1, wherein the N-path filter is a bandstop filter.

5. A device comprising:
    a first port for receiving an ultra-wideband (UWB) signal;
    a filter circuit electrically coupled to the first port for receiving the ultra-wideband (UWB) signal and processing said UWB signal to generate a processed UWB signal; and a second port for receiving the processed UWB; and
an energy detector electrically coupled to the second port;
wherein
the filter circuit comprises:
  a clock source generating a low precision clock signal;
  an N-path filter electrically connected to the clock source having an input port electrically coupled to the first port and an output port electrically coupled to the second port;
the N-path filter has one of a first configuration, a second configuration, and a third configuration;
in the first configuration the N-path filter comprises:
  N parallel paths, each path comprising:
    a first electrical switch disposed between an input port of the N-path filter and an input of a filter having predetermined frequency characteristics; and
    a second electrical switch disposed between an output of the filter having predetermined frequency characteristics and the output port of the N-path filter;
  the first electrical and second electrical switch in each path of the N parallel paths are driven by a clock signal of a plurality of clock signals derived from a clock generated by the low precision clock source;
  the plurality of clock signals are each offset relative to one another; and
  each filter comprises a resistor in series between the first electrical switch and the second electrical switch and a capacitor in parallel to ground between the first electrical switch and the second electrical switch;
in the second configuration the N-path filter comprises:
  N parallel paths, each path comprising:
    a first electrical switch disposed between a resistor and an input of a filter having predetermined frequency characteristics; and
    a second electrical switch disposed between an output of the filter having predetermined frequency characteristics and the output port of the N-path filter;
  the resistor disposed between the input port of the N-path filter and each first electrical switch of the N parallel paths;
  the first electrical and second electrical switch in each path of the N parallel paths are driven by a clock signal of a plurality of clock signals derived from a clock generated by the low precision clock source;
  the plurality of clock signals are each offset relative to one another; and
  each filter comprises a capacitor in parallel to ground between the first electrical switch and the second electrical switch; and
in the third configuration the N-path filter comprises:
  the N-path filter comprises N parallel paths, each path comprising an input port coupled to a first electrical switch which is disposed between a first end of a resistor and an input of a filter having predetermined frequency characteristics;
  the input port of the N-path filter is coupled to a second distal end of the resistor;
  the first electrical switch in each path of the N parallel paths is driven by a clock signal of a plurality of clock signals derived from a clock generated by the low precision clock source;
  the plurality of clock signals are each offset relative to one another;
  each filter comprises a capacitor coupled to ground;
  the output port of the N-path filter is electrically coupled to the first end of the resistor; and
at least one of:
  the energy detector is insensitive to frequency spread of the low precision clock source; and
  the UWB signal received by the UWB receiver comprises a plurality of symbol pulse bundles where each symbol pulse bundle represents a current symbol of a data signal and each symbol pulse bundle comprises a plurality N pulses; wherein each pulse of the N pulses is at a predetermined frequency of a plurality M frequencies, has a predetermined amplitude, and has a predetermined pulse length.

6. The device according to claim 5, wherein
the energy detector comprises a squaring circuit in combination with an integrator.

7. The device according to claim 5, wherein
the N-path filter is a bandpass filter.

8. The device according to claim 5, wherein
the N-path filter is a bandstop filter.

9. A method comprising:
filtering an ultra-wideband (UWB) signal received by a UWB receiver with a filter;
wherein
the filter comprises:
  an N-path filter for receiving the UWB signal;
  a low precision clock source coupled to the N-path filter; and
  an energy detector coupled to the output of the N-path filter; wherein
the N-path filter has one of a first configuration and a second configuration;
in the first configuration the N-path filter comprises:
  a first input port coupled to a first end of a first resistor;
  a second input port coupled to a first end of a second resistor;
  a plurality of N parallel single-sided filters, each single-sided filter comprising:
    a first input coupled to a second distal end of the first resistor and a first electrical switch and therein to a filter having predetermined filter characteristics;
    a second input coupled to a second distal end of the second resistor and to a second electrical switch and therein to the filter having predetermined filter characteristics;
  a first output port electrically coupled to the second distal end of the first resistor and the first input of each single-sided filter of the plurality of N parallel single-sided filters; and
  a second output port electrically coupled to the second distal end of the second resistor and the second input of each single-sided filter of the plurality of N parallel single-sided filters; wherein
the low precision clock source receives a positive clock signal and a negative clock signal and generates four output clock signals having phase offsets of 0°, 90°, 180° and 270°;
the first electrical switches within the plurality of N parallel single-sided filters are sequentially coupled in a repeating sequence to the four clock signals having phase offsets of 0°, 90°, 180° and 270°; and
the second electrical switches within the plurality of N parallel single-sided filters are sequentially coupled in a repeating sequence to the four clock signals having phase offsets of 0°, 90°, 180° and 270° but offset by 180° from the first electrical switch within corresponding single-sided filter of the plurality of N parallel single-sided filters; and in the second configuration the N-path filter comprises:
N parallel paths, each path comprising an input port coupled to a first end of a resistor, a first electrical switch which is disposed between the input port and an input of a filter having predetermined frequency characteristics, and an output port coupled to an output of the filter having predetermined frequency characteristics;
the input port of the N-path filter is coupled to a second distal end of the resistor;
the output port of the N-path filter is coupled to each output port of each path of the N parallel paths;
the first electrical switch in each path of the N parallel paths is driven by a clock signal of a plurality of clock signals derived from a clock generated by the low precision clock source;
the plurality of clock signals are each offset relative to one another; and
each filter comprises a capacitor in series between the first electrical switch and the output port.

10. A method comprising:
filtering an ultra-wideband (UWB) signal received by a UWB receiver with a filter;
wherein
the filter comprises:
an N-path filter for receiving the UWB signal;
a low precision clock source coupled to the N-path filter; and
an energy detector coupled to the output of the N-path filter; wherein
at least one of:
the energy detector is insensitive to frequency spread of the low precision clock source;
and
the UWB signal received by the UWB receiver comprises a plurality of symbol pulse bundles where each symbol pulse bundle represents a current symbol of a data signal; and
each symbol pulse bundle comprises a plurality N pulses; wherein each pulse of the N pulses is at a predetermined frequency of a plurality M frequencies, has a predetermined amplitude, and has a predetermined pulse length.

11. A device comprising:
a first port for receiving an ultra-wideband (UWB) signal;
a filter circuit electrically coupled to the first port for receiving the ultra-wideband (UWB) signal and processing said UWB signal to generate a processed UWB signal; and
a second port for receiving the processed UWB; and
an energy detector electrically coupled to the second port; wherein
the filter circuit comprises:
a clock source generating a low precision clock signal;
an N-path filter electrically connected to the clock source having an input port electrically coupled to the first port and an output port electrically coupled to the second port;
the N-path filter has one of a first configuration and a second configuration;
in the first configuration the N-path filter comprises:
a first input port coupled to a first end of a first resistor;
a second input port coupled to a first end of a second resistor;
a plurality of N parallel single-sided filters, each single-sided filter comprising:
a first input coupled to a second distal end of the first resistor and a first electrical switch and therein to a filter having predetermined filter characteristics;
a second input coupled to a second distal end of the second resistor and to a second electrical switch and therein to the filter having predetermined filter characteristics;
a first output port electrically coupled to the second distal end of the first resistor and the first input of each single-sided filter of the plurality of N parallel single-sided filters; and
a second output port electrically coupled to the second distal end of the second resistor and the second input of each single-sided filter of the plurality of N parallel single-sided filters; wherein
the low precision clock source receives a positive clock signal and a negative clock signal and generates four output clock signals having phase offsets of 0°, 90°, 180° and 270°;
the first electrical switches within the plurality of N parallel single-sided filters are sequentially coupled in a repeating sequence to the four clock signals having phase offsets of 0°, 90°, 180° and 270°; and
the second electrical switches within the plurality of N parallel single-sided filters are sequentially coupled in a repeating sequence to the four clock signals having phase offsets of 0°, 90°, 180° and 270° but offset by 180° from the first electrical switch within corresponding single-sided filter of the plurality of N parallel single-sided filters; and in the second configuration the N-path filter comprises:
N parallel paths, each path comprising an input port coupled to a first end of a resistor, a first electrical switch which is disposed between the input port and an input of a filter having predetermined frequency characteristics, and an output port coupled to an output of the filter having predetermined frequency characteristics;
the input port of the N-path filter is coupled to a second distal end of the resistor;
the output port of the N-path filter is coupled to each output port of each path of the N parallel paths;
the first electrical switch in each path of the N parallel paths is driven by a clock signal of a plurality of clock signals derived from a clock generated by the low precision clock source;
the plurality of clock signals are each offset relative to one another;
each filter comprises a capacitor in series between the first electrical switch and the output port.

12. A device comprising:
a first port for receiving an ultra-wideband (UWB) signal;
a filter circuit electrically coupled to the first port for receiving the ultra-wideband (UWB) signal and processing said UWB signal to generate a processed UWB signal; and
a second port for receiving the processed UWB; and
an energy detector electrically coupled to the second port; wherein
the filter circuit comprises:
a clock source generating a low precision clock signal; and an N-path filter electrically connected to the clock source having an input port electrically coupled to the first port and an output port electrically coupled to the second port; and at least one of:

the energy detector is insensitive to frequency spread of the low precision clock source;

and the received UWB signal comprises a plurality of symbol pulse bundles where each symbol pulse bundle represents a current symbol of a data signal; and each symbol pulse bundle comprises a plurality N pulses; wherein each pulse of the N pulses is at a predetermined frequency of a plurality M frequencies, has a predetermined amplitude, and has a predetermined pulse length.

* * * * *